United States Patent
Pyo

(10) Patent No.: US 9,899,081 B2
(45) Date of Patent: Feb. 20, 2018

(54) RESISTIVE MEMORY DEVICE AND A MEMORY SYSTEM INCLUDING THE SAME

(71) Applicant: SAMSUNG ELECTRONICS CO., LTD., Suwon-si, Gyeonggi-Do (KR)

(72) Inventor: Suk-Soo Pyo, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/450,831

(22) Filed: Mar. 6, 2017

(65) Prior Publication Data

US 2017/0309330 A1 Oct. 26, 2017

(30) Foreign Application Priority Data

Apr. 21, 2016 (KR) .......................... 10-2016-0048962

(51) Int. Cl.
*G11C 11/00* (2006.01)
*G11C 13/00* (2006.01)

(52) U.S. Cl.
CPC ........ *G11C 13/004* (2013.01); *G11C 13/0026* (2013.01); *G11C 13/0028* (2013.01); *G11C 13/0064* (2013.01); *G11C 13/0069* (2013.01); *G11C 13/0097* (2013.01)

(58) Field of Classification Search
CPC .............. G11C 13/004; G11C 13/0069; G11C 13/0028; G11C 13/0064; G11C 13/0097; G11C 13/0026

USPC .................... 365/148, 203, 205, 207, 189.15
See application file for complete search history.

(56) References Cited

U.S. PATENT DOCUMENTS

| | | | |
|---|---|---|---|
| 6,256,247 B1 | 7/2001 | Perner | |
| 6,504,752 B2 | 1/2003 | Ito | |
| 6,678,189 B2 | 1/2004 | Tran | |
| 7,038,959 B2 | 5/2006 | Garni | |
| 7,203,129 B2 | 4/2007 | Lin et al. | |
| 7,518,903 B2 * | 4/2009 | Shirahama ............. | G11C 5/148 365/148 |
| 7,548,451 B2 | 6/2009 | Oh et al. | |
| 7,778,065 B2 | 8/2010 | Lamorey et al. | |
| 7,995,372 B2 | 8/2011 | Toda | |

* cited by examiner

*Primary Examiner* — David Lam
(74) *Attorney, Agent, or Firm* — F. Chau & Associates, LLC

(57) ABSTRACT

A memory device includes a memory cell array, a read circuit, and a control logic. The memory cell array includes a memory cell having a resistance level that varies depending on data stored therein. The memory cell is connected to a first signal line and a second signal line. The read circuit is configured to read the data. The control logic is configured to precharge a sensing node, connected to the first signal line through a first switching device, and a first node, connected to the second signal line through a second switching device, to different voltage levels during a first period, and develop a voltage of the sensing node based on the resistance level of the memory cell during a second period.

15 Claims, 25 Drawing Sheets

RESISTIVE MEMORY DEVICE AND A MEMORY SYSTEM INCLUDING THE SAME

CROSS-REFERENCE TO RELATED APPLICATION

This application claims priority under 35 U.S.C. § 119 to Korean Patent Application No. 10-2016-0048962, filed on Apr. 21, 2016 in the Korean Intellectual Property Office, the disclosure of which is incorporated by reference herein in its entirety.

TECHNICAL FIELD

Exemplary embodiments of the inventive concept relate to a resistive memory device, and more particularly, to a resistive memory device for reading data of resistive memory cells and a memory system including the resistive memory device.

DISCUSSION OF RELATED ART

Semiconductor memory devices, which are devices for storing information, may be classified into two categories: volatile memory devices and non-volatile memory devices. Examples of non-volatile memory devices may include phase change random access memory (PRAM), resistive random access memory (RRAM), magnetic random access memory (MRAM), and ferroelectric random access memory (FRAM). The RRAM may use a material with variable resistance characteristics such as a complex metal oxide, the MRAM may use a ferromagnetic material, and the FRAM may use a ferroelectric capacitor.

In the field of semiconductor memory devices, various studies have been performed to increase performance. For example, when data of a unit cell of a resistive memory is read, a relatively large amount of time may be required to secure a predetermined sensing margin, and thus, read performance may be lowered. Performance degradation may occur due to various causes, such as a variation in a manufacturing process of a semiconductor memory device or a variation in a signal that is provided to various circuits (for example, data write or read circuits) for operating the semiconductor memory device.

SUMMARY

According to an exemplary embodiment of the inventive concept, a memory device includes a memory cell array, a read circuit, and a control logic. The memory cell array includes a memory cell having a resistance level that varies depending on data stored therein. The memory cell is connected to a first signal line and a second signal line. The read circuit is configured to read the data. The control logic is configured to precharge a sensing node, connected to the first signal line through a first switching device, and a first node, connected to the second signal line through a second switching device, to different voltage levels during a first period, and develop a voltage of the sensing node based on the resistance level of the memory cell during a second period.

According to an exemplary embodiment of the inventive concept, a memory system includes a resistive memory device and a memory controller configured to control the resistive memory device. The resistive memory device includes a memory cell array, a control logic, and a read circuit. The memory cell array includes a memory cell for storing first data. The memory cell is connected to a first signal line and a second signal line. The control logic is configured to control a read operation for the first data. The read circuit is configured to precharge a sensing node and a first node to different voltage levels during a first period in response to a read control signal received from the control logic. The sensing node is connected to the first signal line through a first switching device and the first node is connected to the second signal line through a second switching device.

According to an exemplary embodiment of the inventive concept, a memory device includes a memory cell array, a reference voltage provider, and a sense amplifier. The memory cell array includes a normal memory cell region and a reference memory cell region. The normal memory cell region includes a normal memory cell and the reference memory cell region includes a first reference memory cell and a second reference memory cell. The reference voltage provider is configured to generate a first reference voltage based on reference sensing voltages sensed at reference sensing nodes connected to the first reference memory cell and the second reference memory cell. The sense amplifier is configured to compare the first reference voltage with a sensing voltage sensed at a sensing node connected to the normal memory cell, and output first data stored in the normal memory cell. Second data stored in the first reference memory cell is complementary to the first data and third data stored in the second reference memory cell is complementary to the second data. The sensing node connected to the normal memory cell and the reference sensing nodes connected to the first and second reference memory cells are precharged to a precharge voltage during a first period.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
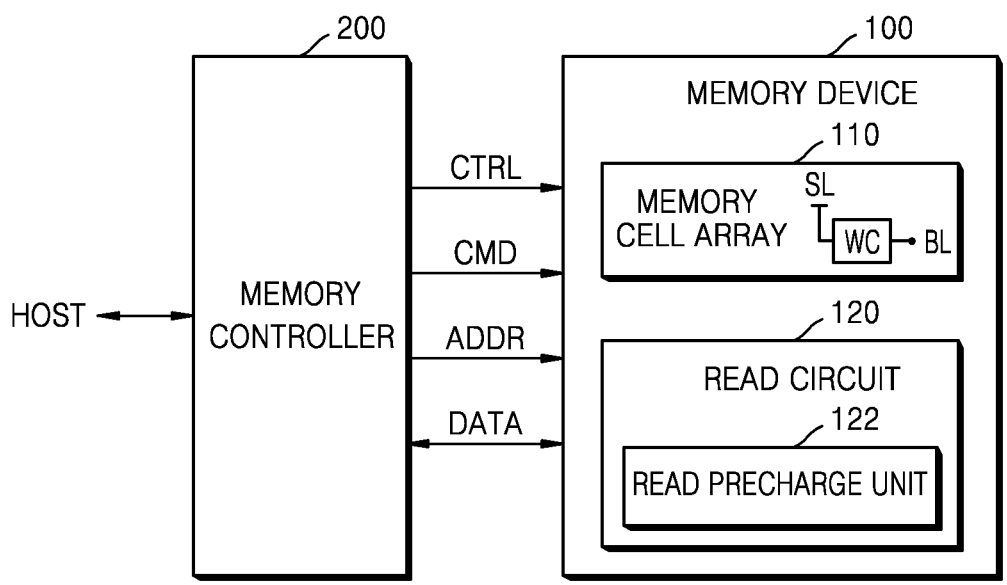
FIG. 1 is a block diagram of a memory system according to an exemplary embodiment of the inventive concept.

Exemplary embodiments of the inventive concept will be described more fully hereinafter with reference to the accompanying drawings. Like reference numerals may refer to like elements throughout the accompanying drawings.

Exemplary embodiments of the inventive concept provide a memory device and a memory system including the memory device capable of increasing performance of read operations.

FIG. 1 is a block diagram of a memory system 10 according to an exemplary embodiment of the inventive concept.

Referring to FIG. 1, the memory system 10 may include a memory device 100 and a memory controller 200. The memory device 100 may include a memory cell array 110 and a read circuit 120.

In response to a write/read request from a host HOST, the memory controller 200 may read data stored in the memory device 100 or may write data to the memory device 100. For example, the memory controller 200 may provide an address ADDR, a command CMD, and a control signal CTRL to the memory device 100, and thus may control a program (or write) operation, a read operation, and an erase operation in the memory device 100. In addition, data DATA for the program operation may be transmitted from the memory controller 200 to the memory device 100, and data DATA read from the memory device 100 for the read operation may be received by the memory controller 200.

The memory controller 200 may include Random Access Memory (RAM), a processing unit, a host interface, and a memory interface. The RAM may be used as an operation memory of the processing unit. The processing unit may control operations of the memory controller 200. The host interface may include a protocol for exchanging data between the host HOST and the memory controller 200. For example, the memory controller 200 may communicate with an external source (e.g., the host HOST) by using at least one of various interface protocols including Universal Serial Bus (USB), MultiMediaCard (MMC), Peripheral Component Interconnect Express (PCI-E), Advanced Technology Attachment (ATA), Serial-ATA, Parallel-ATA, Small Computer System Interface (SCSI), Earth Science Data Interface (ESDI), or Integrated Drive Electronics (IDE).

The memory cell array 110 may include a plurality of memory cells, and each of the memory cells may be connected between a first signal line and a second signal line. In an exemplary embodiment of the inventive concept, the first signal line may be a bit line BL, and the second signal line may be a source line SL. According to exemplary embodiments of the inventive concept, the first signal line may be the source line SL, and the second signal line may be the bit line BL. In addition, each of the memory cells may be connected to a sensing node via the first signal line and a switching device and may be connected to a first node via the second signal line and a switching device.

In an exemplary embodiment of the inventive concept, each of the memory cells may be a single-level cell configured to store one-bit data, and may have two resistance distributions depending on stored data. According to exemplary embodiments of the inventive concept, each of the memory cells may be a multi-level cell configured to store two-bit data, and may have four resistance distributions depending on stored data. According to exemplary embodiments of the inventive concept, each of the memory cells may be a triple-level cell configured to store three-bit data, and may have eight resistance distributions depending on stored data. However, the inventive concept is not limited thereto. According to exemplary embodiments of the inventive concept, the memory cell array 110 may include memory cells that each store four or more bits of data. In addition, the memory cell array 110 may include multi-level cells or triple-level cells as well as single-level cells.

In the present exemplary embodiment, the memory cells may include resistive memory cells, each of which includes a variable resistor having a variable resistance depending on stored data. As one example, the variable resistor may include a phase change material (e.g., Ge—Sb—Te (GST)). If a resistance of the variable resistor changes as a temperature changes, the memory device 100 may be a phase change RAM (PRAM). As another example, when the variable resistor includes an upper electrode, a lower electrode, and transition metal oxide therebetween, the memory device 100 may be a resistive RAM (RRAM). As another example, when the variable resistor includes an upper electrode including a magnetic material, a lower electrode including a magnetic material, and a dielectric therebetween, the memory device 100 may be a magnetic RAM (MRAM).

The read circuit 120 may perform a read operation on a memory cell selected from among the plurality of memory cells. The read circuit 120 may be selectively connected to a selected word line connected to the selected memory cell. In an exemplary embodiment of the inventive concept, the read circuit 120 may read data stored in a memory cell, based on a sensing voltage of a sensing node during a sensing period. According to exemplary embodiments of the inventive concept, the read circuit 120 may read data stored in a memory cell, based on a cell current flowing in the memory cell. In an exemplary embodiment of the inventive concept, the read circuit 120 may include a read precharge unit 122.

In the present exemplary embodiment, in response to a read command received from the memory controller 200, the read precharge unit 122 may precharge the sensing node, connected to the first signal line of the selected memory cell, and the first node, connected to the second signal line of the selected memory cell, to different voltage levels during a first period. During a second period, a voltage level of the sensing node may be developed based on a resistance level of the selected memory cell. During a third period, the read circuit 120 may read data stored in the selected memory cell by comparing a sensing voltage of the sensing node of the selected memory cell to a reference voltage. In other words, the read circuit 120 may read data by comparing the sensing voltage corresponding to the voltage of the first signal line to the reference voltage. For example, the first signal line may be the bit line BL and the second signal line may be the source line SL. Hereinafter, the first signal line is the bit line BL and the second signal line is the source line SL. However, the inventive concept is not limited thereto, and the first signal line may be the source line SL and the second signal line may be the bit line BL, as described above. Additionally, hereinafter, the first node will be referred to as a charge sharing node.

The memory controller 200 and the memory device 100 may be integrated into a semiconductor device. For example, the memory controller 200 and the memory device 100 may be integrated into a semiconductor device and thus may configure a memory card. As one example, the memory controller 200 and the memory device 100 may be integrated into a semiconductor device and thus may configure a PC card such as a peripheral computer memory card international association (PCMCIA) card, a compact flash (CF) card, a smart media card (SM/SMC), a memory stick, a multimedia card (e.g., MMC, RS-MMC, MMCmicro), a secure digital card (e.g., SD, miniSD, microSD), or universal flash storage (UFS). As another example, the memory controller 200 and the memory device 100 may be integrated into a semiconductor device and thus may configure a Solid State Disk/Drive (SSD).

Figure 2:
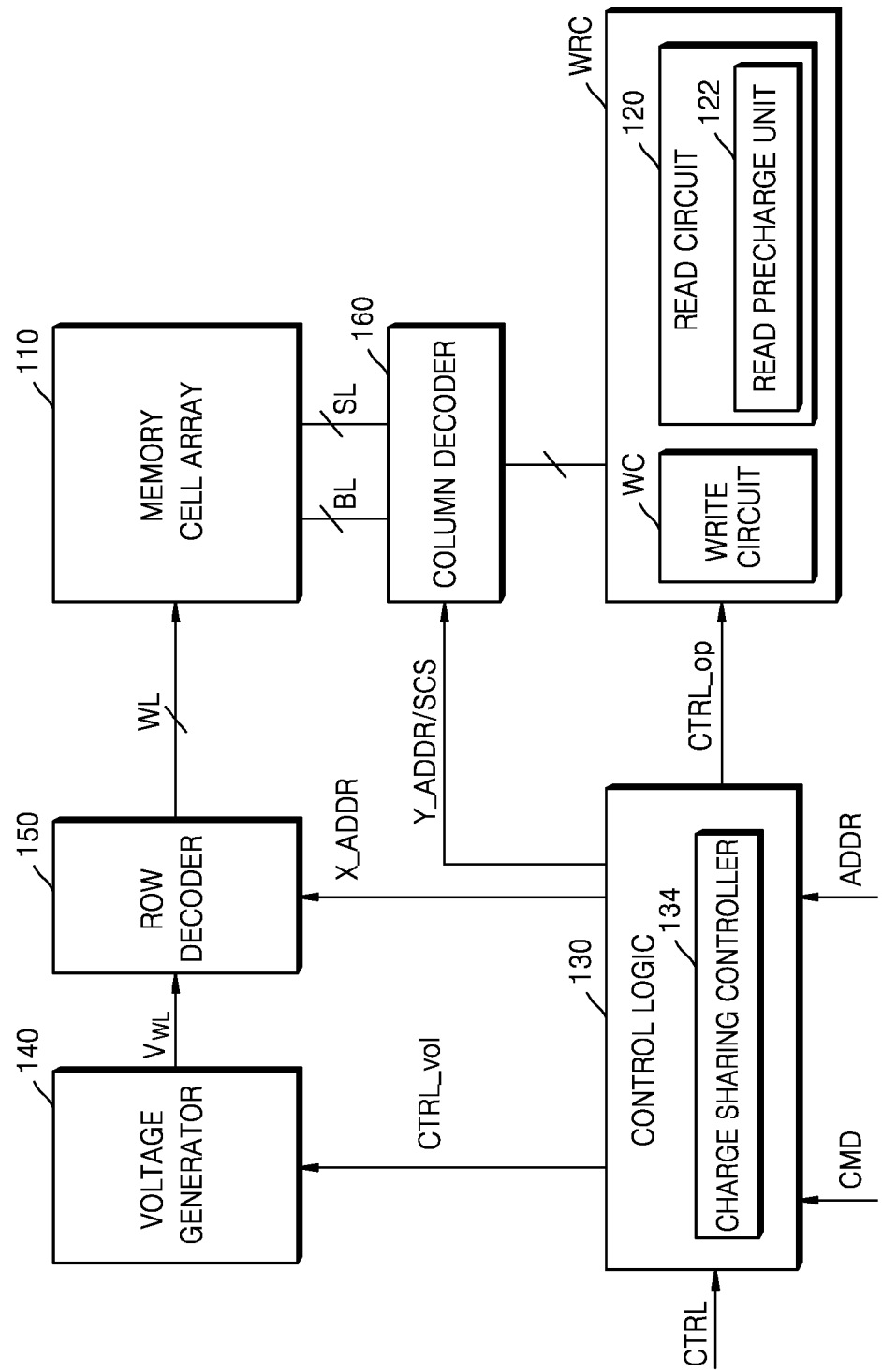
FIG. 2 is a detailed block diagram of a memory device included in the memory system of FIG. 1 according to an exemplary embodiment of the inventive concept.

FIG. 2 is a detailed block diagram of the memory device 100 included in the memory system 10 of FIG. 1 according to an exemplary embodiment of the inventive concept.

Referring to FIG. 2, the memory device 100 may include the memory cell array 110, a write/read circuit WRC, a control logic 130, a voltage generator 140, a row decoder 150, and a column decoder 160, and the write/read circuit WRC may include a write circuit WC and the read circuit 120. Hereinafter, components included in the memory device 100 will be described.

The memory cell array 110 may be connected to a plurality of first signal lines and a plurality of second signal lines. In addition, the memory cell array 110 may include the plurality of memory cells connected to the plurality of first signal lines and the plurality of second signal lines. Hereinafter, exemplary embodiments will be described with the assumption that the plurality of first signal lines are bit lines BL and the plurality of second signal lines are source lines SL.

Figure 3:
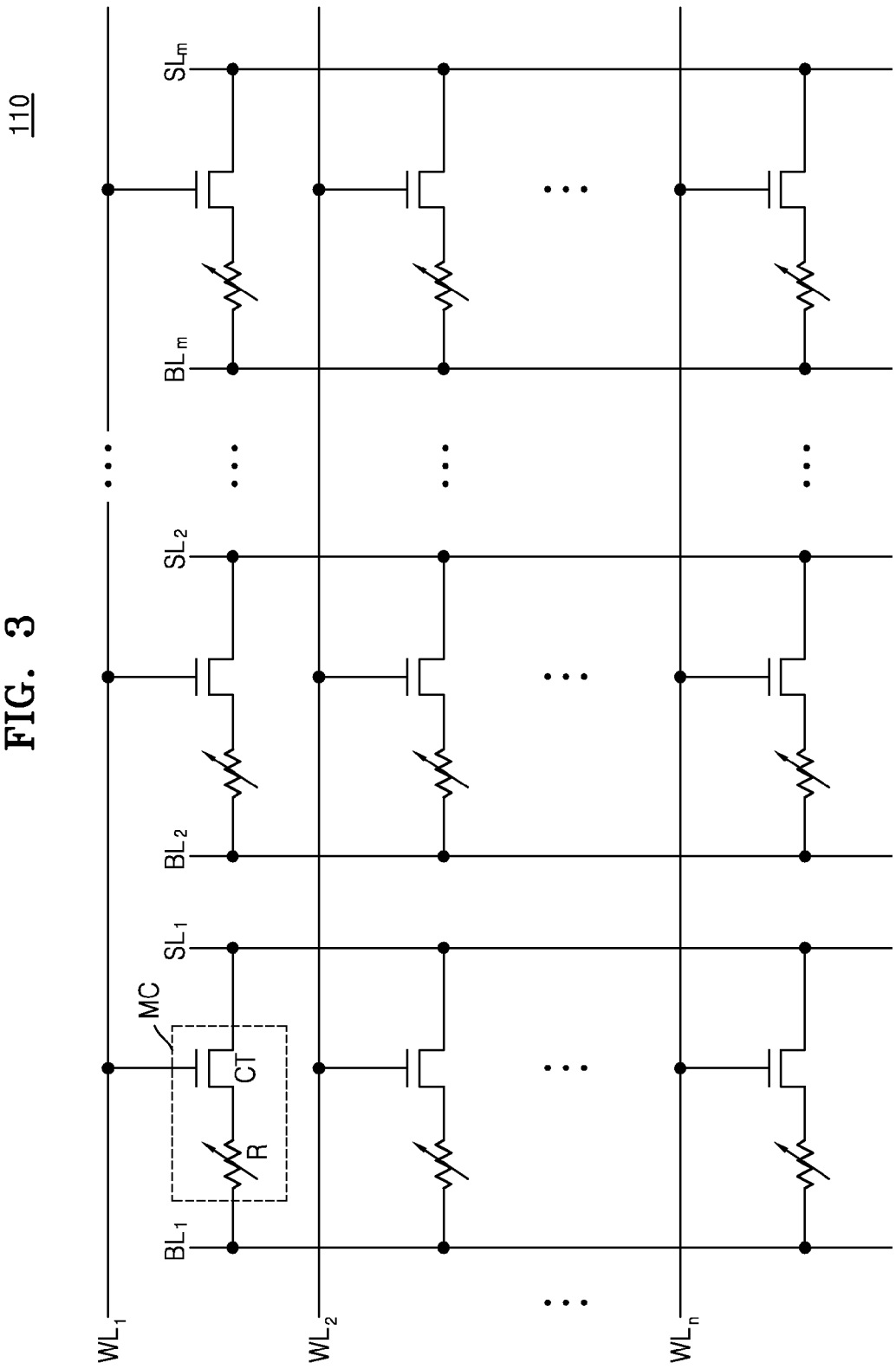
FIG. 3 is a detailed circuit diagram of a memory cell array of FIG. 2 according to an exemplary embodiment of the inventive concept.

FIG. 3 is a detailed circuit diagram of the memory cell array 110 of FIG. 2 according to an exemplary embodiment of the inventive concept.

Referring to FIG. 3, the memory cell array 110 may be a two-dimensional memory having a horizontal structure and include a plurality of word lines WL1 to WLn, a plurality of bit lines BL1 to BLm, a plurality of source lines SL1 to SLm, and a plurality of memory cells MC. The number of word lines WL, the number of bit lines BL, the number of source lines SL1 to SLm, and the number of memory cells MC may vary. However, the inventive concept is not limited thereto. In addition, the memory cell array 110 may be a three-dimensional memory having a vertical structure.

In the present exemplary embodiment, each of the memory cells MC may include a variable resistor R and a selection device CT. The variable resistor R may be a variable resistance material, and the selection device CT may be a switching device.

In an exemplary embodiment of the inventive concept, the variable resistor R may be between one of the bit lines BL1 to BLm and one of the source lines SL1 to SLm, and the selection device CT may be between the variable resistor R and one of the word lines WL1 to WLn. In other words, a memory cell MC connected to a first bit line BL1 may be connected to a first source line SL1. However, the inventive concept is not limited thereto, and various connection schemes may be used. For example, a memory cell MC connected to a first word line WL1 may be connected to the first source line SL1.

The variable resistor R may be changed into one of a plurality of resistance states by applying an electric pulse thereto. In an exemplary embodiment of the inventive concept, the variable resistor R may include a phase change material that changes its crystalline state depending on an amount of a current. The phase change material may include various materials such as GaSb, InSb, InSe, Sb2Te3, and GeTe in which two elements are combined, GeSbTe, GaSeTe, InSbTe, SnSb2Te4, and InSbGe in which three elements are combined, and AgInSbTe, (GeSn)SbTe, GeSb(SeTe), and Te81Ge15Sb2S2 in which four elements are combined.

The phase change material may have an amorphous state having a relatively high resistance and a crystal state having a relatively low resistance. In the phase change material, the phase may be changed by Joule heating generated according to an amount of a current. Accordingly, data may be written in the memory cell MC based on the phase change.

According to exemplary embodiments of the inventive concept, the variable resistor R may include a perovskite compound, a transition metal oxide, a magnetic material, a ferromagnetic material, or an anti-ferromagnetic material, instead of the phase change material.

The selection device CT may be connected between one of the word lines WL1 to WLn and the variable resistor R corresponding thereto, and a current supplied to the variable resistor R may be controlled according to a voltage applied to the connected word line and a bit line. Although the selection device CT is illustrated as a transistor in FIG. 3, the inventive concept is not limited thereto. According to exemplary embodiments of the inventive concept, the selection device CT may be other switching devices.

Referring back to FIG. 2, the write circuit WC may be connected to the selected bit line to provide a write pulse to the selected memory cell and then perform a write operation on the selected memory cell. In this regard, data DATA to be stored may be input to the memory cell array 110. In an exemplary embodiment of the inventive concept, the write pulse may be a current pulse. Alternatively, the write pulse may be a voltage pulse.

The control logic 130 may output various control signals for writing data DATA to the memory cell array 110 or reading data DATA from the memory cell array 110, based on the command CMD, the address ADDR, and the control signal CTRL received from the memory controller 200. The various control signals output from the control logic 130 may be provided to the write/read circuit WRC, the voltage generator 140, the row decoder 150, and the column decoder 160, and thus, the control logic 130 may control overall operations of the memory device 100.

For example, the control logic 130 may provide various operation control signals CTRL_op to the write/read circuit WRC. For example, the operation control signals CTRL_op may include a write enable signal, a read enable signal, a sensing enable signal, a discharge enable signal, a precharge enable signal, and a read-precharge enable signal. In addition, the control logic 130 may provide a voltage control signal CTRL_vol to the voltage generator 140. Furthermore, the control logic 130 may provide a row address X_ADDR to the row decoder 150 and a column address Y_ADDR to the column decoder 160. When a read command is received from the memory controller 200 of FIG. 1, the control logic 130 may control the read circuit 120 so that the read circuit 120 performs a read operation on a memory cell.

The read circuit 120 may be connected to a selected bit line and read data DATA stored in a selected memory cell. In the present exemplary embodiment, the read circuit 120 may include the read precharge unit 122. In an exemplary embodiment of the inventive concept, the control logic 130 may control the read precharge unit 122 to read-precharge the sensing node, connected to a bit line of a selected memory cell via a switching device, to a first voltage level, and read-precharge the charge sharing node, connected to a source line of the selected memory cell via a switching device, to a second voltage level. For example, the read precharge unit 122 may provide different voltages having different levels to the sensing node and the charge sharing node. Because a voltage level of the sensing node is different from that of the charge sharing node, there is a potential difference between the sensing node and the charge sharing node.

In the present exemplary embodiment, a charge sharing controller 134 of the control logic 130 may control a sensing voltage of the sensing node, read-precharged to the first voltage level, to be developed. For example, the charge sharing controller 134 may control the sensing voltage of the sensing node to be developed, by using the potential difference generated between the sensing node of the selected memory cell and the charge sharing node by the read precharge unit 122. In detail, the charge sharing controller 134 may turn on the switching device, connected to the sensing node and the charge sharing node, so that a current flows in the selected memory cell due to the potential difference. The switching devices may be in a multiplexer included in the column decoder 160, and the charge sharing controller 134 may provide a selection control signal SCS to the switching devices of the column decoder 160 to turn on/off the switching devices. The amount of current flowing in the selected memory cell may vary depending on the resistance level of the selected memory cell. Thus, based on the resistance of the selected memory cell, the charge sharing controller 134 may change the extent of development of the sensing voltage of the sensing node of the selected memory cell. When a development operation for the sensing node of the selected memory cell is completed, the charge sharing controller 134 may turn off the switching devices, connected to the sensing node of the selected memory cell and the charge sharing node. Then, the read circuit 120 may read data stored in the selected memory cell by comparing the sensing voltage of the sensing node of the selected memory cell to a reference voltage. Although the charge sharing controller 134 is included in the control logic 130 in FIG. 2, the inventive concept is not limited thereto. For example, the charge sharing controller 134 may be included in the read circuit 120.

Before the write circuit WC performs a write operation on a memory cell that is a target for the write operation, the read circuit 120 may perform a pre-read operation to determine an initial resistance state of the memory cell. Furthermore, after the write operation is performed on the memory cell, the read circuit 120 may perform a verify-read operation to determine whether the write operation on the memory cell has been completed.

Accordingly, the read circuit 120 may read the resistance of each of the memory cells, and provide a read result to the write circuit WC or the control logic 130. In detail, in a general read operation, the read circuit 120 may provide read data DATA to the outside of the memory device 100, e.g., to the memory controller 200. In addition, in the pre-read operation and the verify-read operation, the read circuit 120 may provide read data DATA within the memory device 100, e.g., to the control logic 130 or the write circuit WC as a pass/fail signal P/F that indicates a success/failure of the write operation.

In the present exemplary embodiment, the write/read circuit WRC may be connected to the column decoder 160, and thus may be selectively connected to a bit line and a source line of a memory cell through the column decoder 160. However, the inventive concept is not limited thereto. For example, the write/read circuit WRC may be connected to the row decoder 150, and thus may be selectively connected to a word line.

The control logic 130 may output various control signals for writing data DATA to the memory cell array 110 or reading data DATA from the memory cell array 110 based on the command CMD, the address ADDR, and the control signal CTRL received from the memory controller 200. The various control signals output from the control logic 130 may be provided to the write/read circuit WRC, the voltage generator 140, the row decoder 150, and the column decoder 160, and thus, the control logic 130 may control overall operations of the memory device 100.

The voltage generator 140 may generate various voltages to perform a write, a read and an erase operation on the memory cell array 110 based on the voltage control signal CTRL_vol. In detail, the voltage generator 140 may generate a first driving voltage $V_{WL}$ for driving the plurality of word lines and a second driving voltage $V_{BL}$ for driving the plurality of bit lines. Here, the first driving voltage $V_{WL}$ may include a reset write voltage, a set write voltage, an inhibit voltage, a read voltage, a program verify voltage, or the like. In addition, the second driving voltage $V_{BL}$ may include a reset write voltage, a set write voltage, an inhibit voltage, or the like. In a memory cell of the memory cell array 110, a reset write voltage and a set write voltage may be applied to a word line WL or a bit line BL according to a connection direction of the selection device CT.

The row decoder 150 may be connected to the memory cell array 110 via the plurality of word lines WL, and activate a word line selected from the plurality of word lines WL in response to the row address X_ADDR received from the control logic 130. In detail, the row decoder 150 may control a voltage, which is applied to a word line selected from the plurality of word lines WL, in response to the row address X_ADDR or may control a connection relation of the selected word line.

The column decoder 160 may be connected to the memory cell array 110 via the plurality of bit lines BL, and may activate a bit line selected from the plurality of bit lines BL in response to the column address Y_ADDR received from the control logic 130. In detail, in order to perform a read operation, the column decoder 160 may be connected to the memory cell array 110 via the bit lines BL and the source lines SL, and may activate a bit line selected from the bit lines BL and a source line selected from the source lines SL, in response to the selection control signal SCS received from the charge sharing controller 134. This will be described in detail below.

Figure 4:
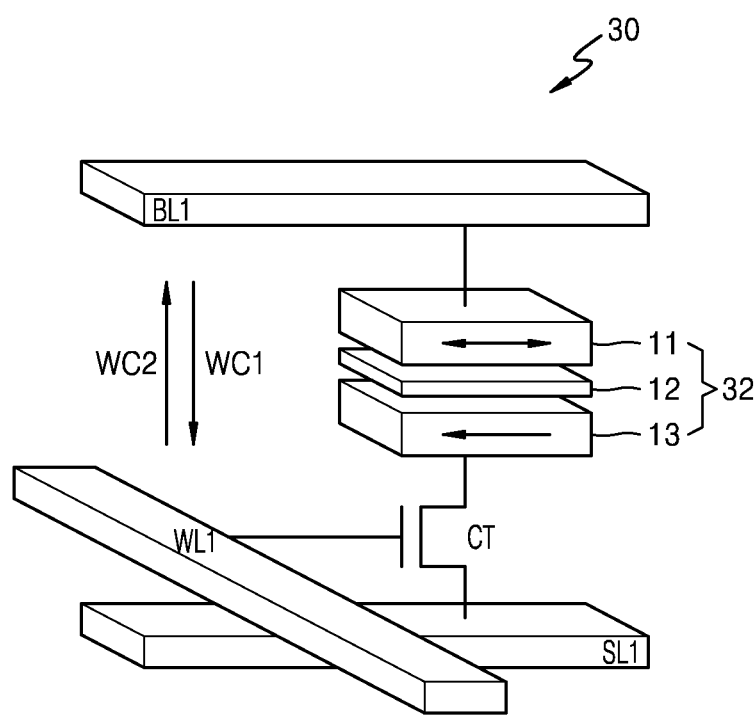
FIG. 4 is a three-dimensional diagram illustrating an implementation of a spin transfer torque magneto resistive random access memory (STT-MRAM) that is an example of a non-volatile memory included in the memory cell array of FIG. 2 according to an exemplary embodiment of the inventive concept.

FIG. 4 is a three-dimensional diagram illustrating an implementation of a spin transfer torque magneto resistive random access memory (STT-MRAM) that is an example of a non-volatile memory included in the memory cell array 110 of FIG. 2 according to an exemplary embodiment of the inventive concept.

Referring to FIG. 4, a memory cell 30 includes a magnetic tunnel junction (MTJ) device 320 and a cell transistor CT. A gate of the cell transistor CT is connected to a word line (e.g., the first word line WL1), and an electrode of the cell transistor CT is connected to a bit line (e.g., the first bit line BL1) via the MTJ device 32. The other electrode of the cell transistor CT is connected to a source line (e.g., the first source line SL1). The cell electrode CT may correspond to the selection device CT of FIG. 3.

The MTJ device 32 includes a pinned layer 13, a free layer 11, and a tunnel layer 12. A magnetization direction of the pinned layer 13 is fixed, and a magnetization direction of the free layer 11 may be the same as or opposite to that of the pinned layer 13. The MTJ device 32 may further include an anti-ferromagnetic layer to fix the magnetization direction of the pinned layer 13.

To perform a write operation of the STT-MRAM, a voltage having a logic high level is applied to the first word line WL1 to turn on the cell transistor CT, and a write current WC1 or WC2 is applied between the first bit line BL1 and the first source line SL1.

To perform a read operation of the STT-MRAM, a voltage having a logic high level is applied to the first word line WL1 to turn on the cell transistor CT, and a read current is applied from the first bit line BL1 toward the first source line SL1. In this case, data stored in the MTJ device 32 may be determined depending on a measured resistance value. Hereinafter, the description will assume that the non-volatile memory is the STT-MRAM. However, the inventive concept is not limited thereto, and the non-volatile memory may be any one of various resistive memories.

Figure 5:
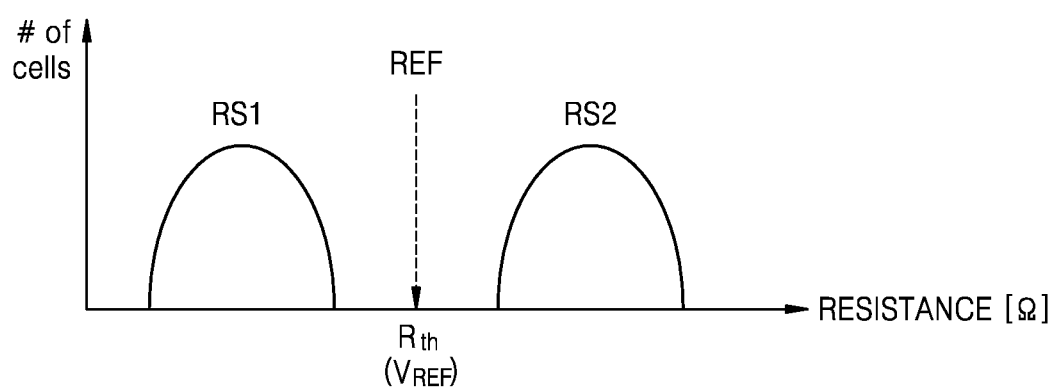
FIG. 5 is a graph showing an ideal distribution of memory cells with respect to resistance when a memory cell of FIG. 3 is a single-level cell according to an exemplary embodiment of the inventive concept.

FIG. 5 is a graph showing an ideal distribution of memory cells with respect to resistance when the memory cell MC of FIG. 3 is a single-level cell according to an exemplary embodiment of the inventive concept.

Referring to FIG. 5, the horizontal axis denotes resistance, and the vertical axis denotes the number of memory cells. For example, if a memory cell is a single-level cell to which 1 bit is programmed, the memory cell may have a low resistance state RS1 or a high resistance state RS2. A set operation or a set write operation refers to a switching operation for the memory cell MC from the high resistance state RS2 to the low resistance state RS1 by applying a write pulse to the memory cell MC. In addition, a reset operation or a reset write operation refers to a switching operation for the memory cell MC from the low resistance state RS1 to the high resistance state RS2 by applying a write pulse to the memory cell MC.

A resistance between the distribution of the low resistance state RS1 and the distribution of the high resistance state RS2 may be set to be a threshold resistance $R_{th}$ (as indicated by reference value REF). In a read operation performed on a memory cell, when a read result is greater than or equal to the threshold resistance $R_{th}$, the read result may be determined to be the high resistance state RS2, and when the read result is less than the threshold resistance $R_{th}$, the read result may be determined to be the low resistance state RS1.

In an exemplary embodiment of the inventive concept, a read circuit may read data of a memory cell by comparing the sensing voltage of the sensing node of the memory cell to a reference voltage $V_{REF}$ corresponding to the threshold resistance $R_{th}$.

Figure 6:
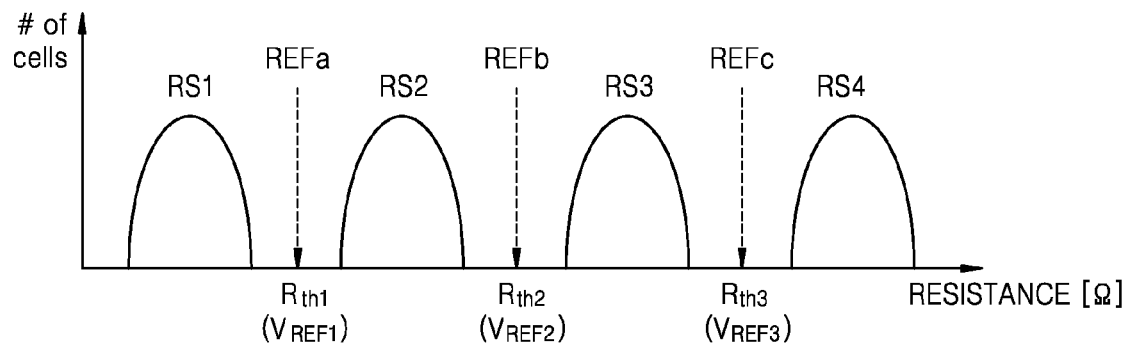
FIG. 6 is a graph showing an ideal distribution of memory cells with respect to resistance when the memory cell of FIG. 3 is a multi-level cell according to an exemplary embodiment of the inventive concept.

FIG. 6 is a graph showing an ideal distribution of memory cells with respect to resistance when the memory cell MC of FIG. 3 is a multi-level cell according to an exemplary embodiment of the inventive concept.

Referring to FIG. 6, the horizontal axis denotes resistance, and the vertical axis denotes the number of memory cells. For example, if a memory cell is a multi-level cell to which 2 bits are programmed, the memory cell may have one of a first resistance state RS1, a second resistance state RS2, a third resistance state RS3, or a fourth resistance state RS4. In an exemplary embodiment of the inventive concept, the first resistance state RS1 and the second resistance state RS2 may be referred to as a low resistance state while the third resistance state RS3 and the fourth resistance state RS4 may be referred to as a high resistance state.

A resistance between the distribution of the first resistance state RS1 and the distribution of the second resistance state RS2 may be set to be a first threshold resistance $R_{th1}$; a resistance between the distribution of the second resistance state RS2 and the distribution of the third resistance state RS3 may be set to be a second threshold resistance $R_{th2}$; and a resistance between the distribution of the third resistance state RS3 and the distribution of the fourth resistance state RS4 may be set to be a third threshold resistance $R_{th3}$. As an example, in a read operation performed on the memory cell MC, when a read result is greater than or equal to the first threshold resistance $R_{th1}$, the read result may be determined to be one of the second to fourth resistance states RS2, RS3, and RS4, and when the read result is less than the first threshold resistance $R_{th1}$, the read result may be determined to be the first resistance state RS1.

In an exemplary embodiment of the inventive concept, data of a memory cell may be read by comparing the sensing voltage of the sensing node of the memory cell to reference voltages $V_{REF1}$, $V_{REF2}$, and $V_{REF3}$ corresponding to first to third threshold resistances $R_{th1}$, $R_{th2}$, and $R_{th3}$, respectively (as indicated by reference values REFa, REFb, and REFc).

The reference voltages $V_{REF}$, $V_{REF1}$, $V_{REF2}$, and $V_{REF3}$, described with reference to FIGS. 5 and 6, may be generated by the voltage generator 140 and may be provided to the read circuit 120. When the memory cell array 110 includes a plurality of reference memory cells, a reference voltage, generated by using a reference sensing voltage of a reference sensing node of each of the reference memory cells, may be provided to the read circuit 120. However, the inventive concept is not limited thereto, and the read circuit 120 may further include a reference voltage generator and may perform a read operation by using a reference voltage generated from the reference voltage generator.

Figure 7:
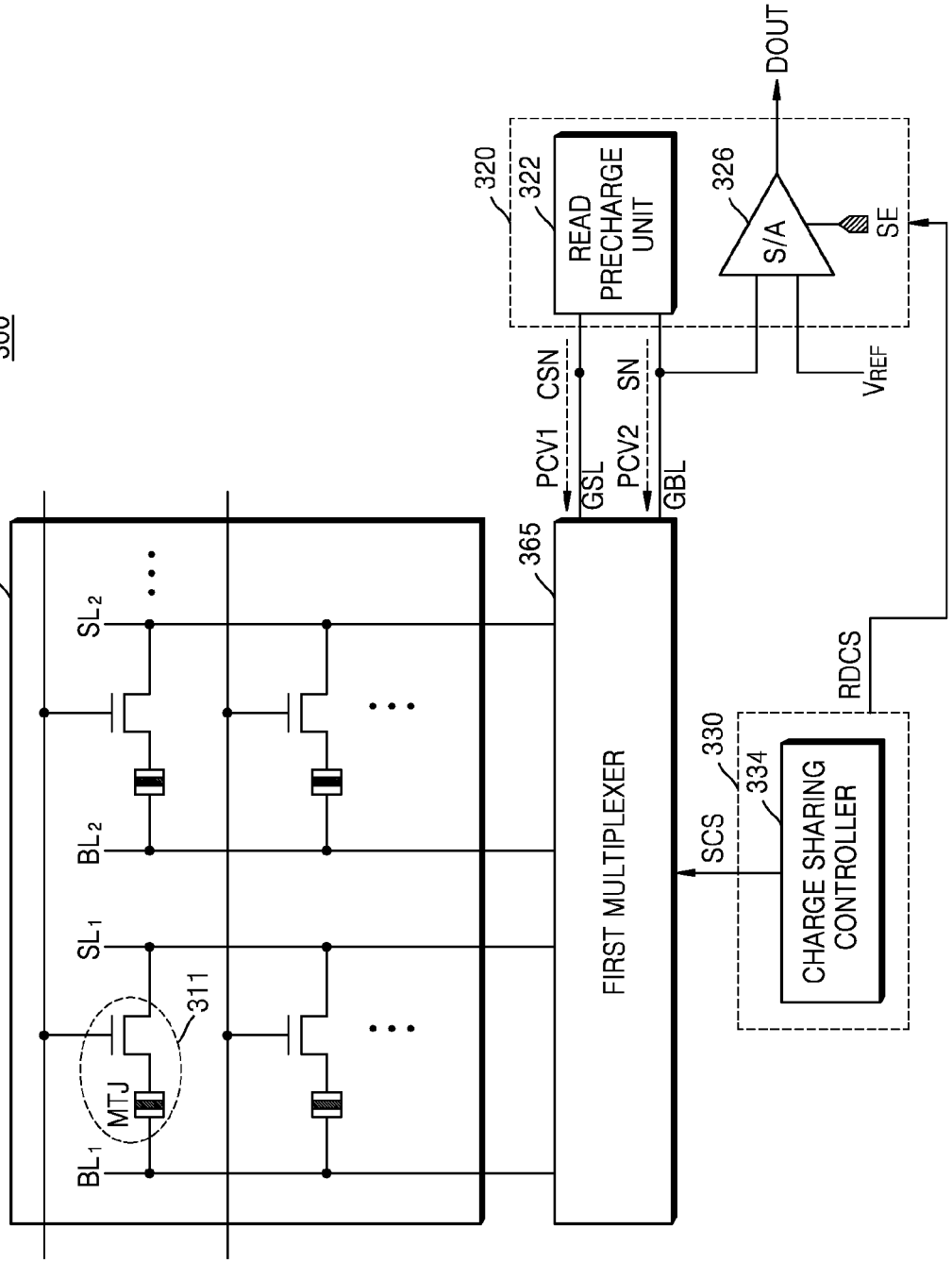
FIG. 7 is a block diagram of a memory device for describing a read operation according to an exemplary embodiment of the inventive concept.

FIG. 7 is a block diagram of a memory device 300 for describing a read operation according to an exemplary embodiment of the inventive concept.

Referring to FIG. 7, the memory device 300 includes a memory cell array 310, a read circuit 320, and a first multiplexer 365. The memory cell array 310 includes the plurality of word lines WL1 to WLn (where n is a natural number that is greater than or equal to 1), the plurality of bit lines BL1 to BLm (where m is a natural number that is greater than or equal to 1), the plurality of source lines SL1 to SLm, and a plurality of memory cells 311 arranged between the bit lines BL1 to BLm and the source lines SL1 to SLm. When each of the memory cells 311 is an STT-MRAM cell, each of the memory cells 311 includes an MTJ device having a magnetic material.

According to the present exemplary embodiment, each of the memory cells 311 includes a cell transistor and the MTJ device. The cell transistor is switched on in response to a signal output from a word line driver. The word line driver may output a word line selection voltage for selecting one of the word lines WL1 to WLn. The word line driver may include a means for deciding a row address. Alternatively, a decoded address from the row decoder 150 of FIG. 2 may be provided to the word line driver. The cell transistor and the MTJ device of each memory cell 311 is connected between one of the bit lines BL1 to BLm and one of the source lines SL1 to SLm.

The MTJ device may be replaced with a resistive device, such as PRAM using a phase change material, RRAM using a variable resistance material such as a transition metal oxide, or MRAM using a ferromagnetic material. The material forming the resistive device has a resistance value that varies depending on the size and/or direction of a current or voltage, and has non-volatile characteristics for maintaining the resistance value even though the current or voltage may be blocked.

The bit lines BL1 to BLm are connected to a write driver. The write driver may apply a current to a memory cell to perform a write operation in response to an external command.

The first multiplexer 365 includes a plurality of switching devices for connecting the bit lines BL1 to BLm to a global bit line GBL and a plurality of switching devices for connecting the source lines SL1 to SLm to a global source line GSL. Hereinafter, a sensing node SN may be referred to as a node at which any one of the bit lines BL1 to BLm is connected to the global bit line GBL, and a charge sharing node CSN may be referred to as a node at which any one of the source lines SL1 to SLm is connected to the global source line GSL.

The read circuit 320 includes a read precharge unit 322 and a sense amplifier 326. Before the read circuit 320 performs a read operation, the sensing node SN and the charge sharing node CSN may be precharged to a ground voltage Vss and the switching devices of the first multiplexer 365 may be turned off. However, the inventive concept is not limited thereto, and the sensing node SN and the charge sharing node CSN may be precharged to a predetermined voltage other than a ground voltage level before a read operation is performed.

During a first period, the read precharge unit 322 may perform a read precharge operation for precharging the charge sharing node CSN to a first precharge voltage PCV1 via the global source line GSL and precharging the sensing node SN to a second pre-charge voltage PCV2 via the global bit line GBL. In an exemplary embodiment of the inventive concept, the level of the first precharge voltage PCV1 may be different from that of the second precharge voltage PCV2. Hereinafter, it is assumed that the level of the first precharge voltage PCV1 is greater than that of the second precharge voltage PCV2. The first period may be referred to as a read precharge period. In addition, the first precharge voltage PCV1 may be referred to as a first voltage and the second precharge voltage PCV2 may be referred to as a second voltage.

When the sensing node SN and the charge sharing node CSN are precharged to the second precharge voltage PCV2 and the first precharge voltage PCV1, respectively, the charge sharing controller 334 may provide a selection control signal SCS to the first multiplexer 365 so that a switching device of the first multiplexer 365 is turned on during a second period. A sensing voltage of the sensing node SN may be developed during the second period. For example, during the second period, when a selection device is connected to the first word line WL1 to perform a read operation and the memory cell 311 connected between the first bit line BL1 and the first source line SL1 is selected, the charge sharing controller 334 may turn on a switching device connected to the first bit line BL1 and a switching device connected to the first source line SL1, from among the switching devices of the first multiplexer 365. Then, due to a potential difference between the sensing node SN and the charge sharing node CSN as a result of the read precharge operation, a current may flow in the memory cell from the first source line SL1 toward the first bit line BL1, and thus, a charge sharing phenomenon may occur, in which charges of the charge sharing node CSN are shared by the sensing node SN. In this case, the amount of current flowing in the memory cell 311 may vary depending on a resistance level of the MJT device included in the memory cell 311. Through such an operation of the charge sharing controller 334, the sensing voltage of the sensing node SN connected to the memory cell 311 may be developed. The second period may be referred to as a development period.

The charge sharing controller 334 may provide the selection control signal SCS to the first multiplexer 365 to control the switching devices of the first multiplexer 365 and complete a development operation for the sensing voltage. In detail, the charge sharing controller 334 may complete the development operation by turning off the switching device connected to the first bit line BL1 and the switching device connected to the first source line SL1 from among the switching devices of the first multiplexer 365. Next, during a third period, the sense amplifier 326 may compare the sensing voltage of the sensing node SN to a reference voltage $V_{REF}$ in response to a sensing enable signal SE and may output data DOUT stored in the memory cell 311. The third period may be referred to as a sensing period. Although the control logic 330 of FIG. 7 includes a functional block representing the charge sharing controller 334, the inventive concept is not limited thereto. For example, the control logic 330 may perform functions of the charge sharing controller 334 without including the functional block of the charge sharing controller 334.

Although the above description has assumed that the memory cell 311 is selected as a target of a read operation, the inventive concept is not limited thereto. For example, the read precharge operation, the development operation, and the sensing operation, as described above, may be performed when another memory cell is selected as a target of a read operation. In addition, the control logic 330 may provide a read control signal RDCS to the read circuit 320 and thus may control various operations including the read precharge operation, the development operation, and the sensing operation. The read control signal RDCS may include a precharge enable signal, a read precharge enable signal, and a sensing enable signal SE.

Figure 8:
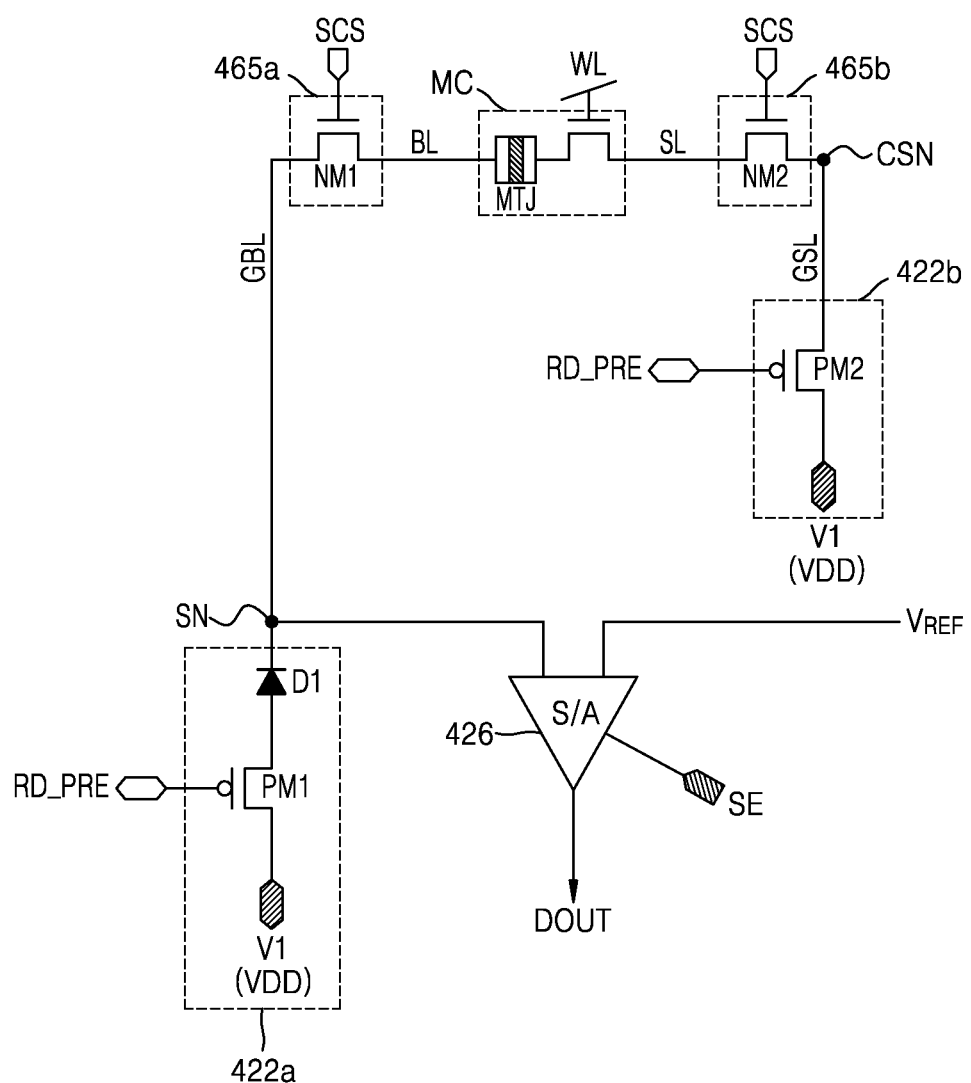
FIG. 8 is a detailed circuit diagram of the memory device illustrated in FIG. 7 according to an exemplary embodiment of the inventive concept.
Figure 9:
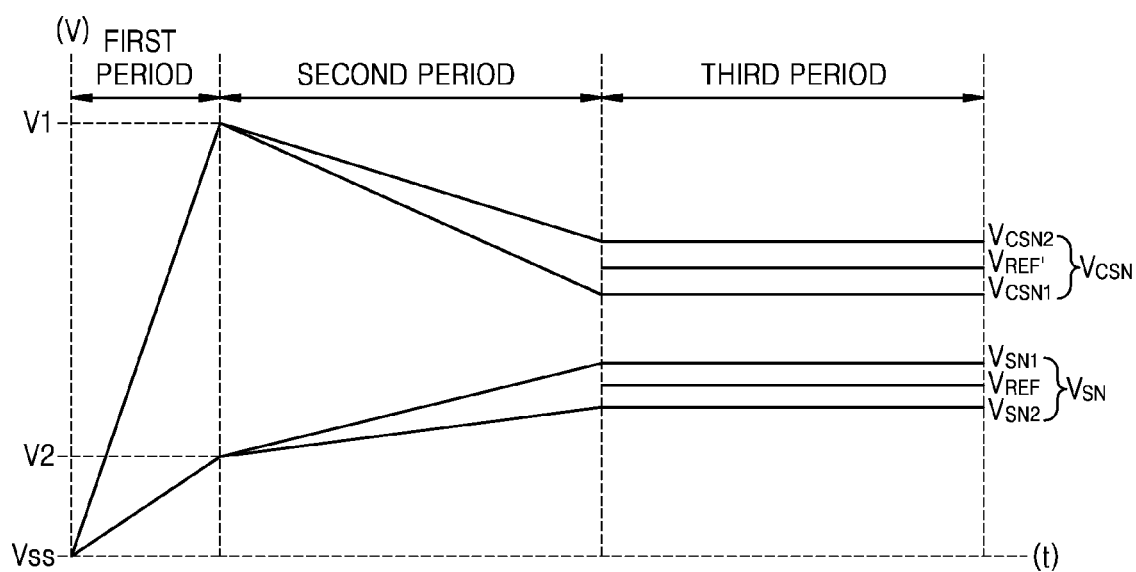
FIG. 9 is a graph illustrating a method of performing a read operation, according to an exemplary embodiment of the inventive concept.

FIG. 8 is a detailed circuit diagram of the memory device 300 illustrated in FIG. 7 according to an exemplary embodiment of the inventive concept. FIG. 9 is a graph illustrating a method of performing a read operation, according to an exemplary embodiment of the inventive concept.

Referring to FIG. 8, a memory device 400, which corresponds to the memory device 300 of FIG. 7, includes the memory cell MC selected as a target of a read operation, a first read precharge unit 422a, a second read precharge unit 422b, and first and second switching devices 465a and 465b. The first and second switching devices 465a and 465b may be switching devices included in the first multiplexer 365 of FIG. 7. The first read precharge unit 422a includes a selection transistor PM1 and a diode D1. The selection transistor PM1 may be connected to a power voltage V1 node in response to a read precharge enable signal RD_PRE. The second read precharge unit 422b includes a selection transistor PM2. The selection transistor PM2 may be connected to the power voltage V1 node in response to the read precharge enable signal RD_PRE. The first switching device 465a may include a selection transistor NM1. A bit line BL of the memory cell MC may be connected to the global bit line GBL, which is connected to a sense amplifier 426, through the selection transistor NM1 in response to the selection control signal SCS received from the charge sharing controller 334 of FIG. 7. The second switching device 465b may include a selection transistor NM2, and a source line SL of the memory cell MC may be connected to the global source line GSL through the selection transistor NM2 in response to the selection control signal SCS received from the charge sharing controller 334 of FIG. 7.

Referring to FIGS. 8 and 9, the first read precharge unit 422a may precharge the sensing node SN, at which the global bit line GBL is connected to the sense amplifier 426, from the level of the ground voltage Vss to the level of a second voltage V2 during a first period, in response to the read precharge enable signal RD_PRE at a logic low level. In an exemplary embodiment of the inventive concept, the second voltage V2 may correspond to a voltage obtained by subtracting a threshold voltage of the diode D1 from a first voltage V1, e.g., the power voltage V1. The second read precharge unit 422b may precharge the charge sharing node CSN of the global source line GSL from the level of the ground voltage Vss to the level of the first voltage V1 during the first period, in response to the read precharge enable signal RD_PRE at a logic low level. The first voltage V1 may correspond to a power voltage $V_{DD}$ supplied from the voltage generator 140 of FIG. 2. When the read precharge operation is performed as described above, the selection transistor NM1 of the first switching device 465a and the selection transistor NM2 of the second switching device 465b may be in a turn-off state. As a result, the control logic 330 of FIG. 7 may control the first read precharge unit 422a and the second read precharge unit 422b to precharge the sensing node SN and the charge sharing node CSN to different voltage levels. According to exemplary embodiments of the inventive concept, the first read precharge unit 422a may include a plurality of diodes to control the level of the second voltage V2. In other words, the first read precharge unit 422a may precharge the sensing node SN to the second voltage V2 obtained by subtracting the sum of threshold voltages of the plurality of diodes from the first voltage V1, and thus, a sensing margin may be increased in a read operation by increasing the difference between the level of the first voltage V1 and the level of the second voltage V2. Alternatively, the first read precharge unit 422a does not include a diode and may be configured to directly receive the second voltage V2 that is lower than the first voltage V1. In this case, the reference voltage $V_{REF}$ may vary depending on the difference between the level of the first voltage V1 and the level of the second voltage V2. This will be described in detail below.

In a second period, the selection transistor NM1 of the first switching device 465a and the selection transistor NM2 of the second switching device 465b may be turned on in response to the selection control signal SCS at a logic high level. The selection control signal SCS is received from the charge sharing controller 334 of FIG. 7. Since the charge sharing node CSN is in a state in which it has been precharged to the level of the first voltage V1 and the sensing node SN is in a state in which it has been precharged to the level of the second voltage V2, a current flows from the source line SL of the memory cell MC toward the bit line BL thereof due to the potential difference between the charge sharing node CSN and the sensing node SN, and thus, a charge sharing phenomenon may occur. Accordingly, in the second period, a sensing voltage $V_{SN}$ of the sensing node SN may be developed and the level of the sensing voltage $V_{SN}$ may increase, and a voltage $V_{CSN}$ of the charge sharing node CSN may be developed and the level of the voltage $V_{CSN}$ may decrease. In this case, the extent of the development of the sensing voltage $V_{SN}$ of the sensing node SN may be changed depending on the resistance level of the MTJ device of the memory cell MC. Hereinafter, the extent of the development refers to the extent in which the level of the sensing voltage $V_{SN}$ is changed during the second period. Hereinafter, for convenience of description, a resistance level of the MTJ device is referred to as a resistance level of the memory cell MC. According to exemplary embodiments of the inventive concept, the charge sharing controller 324 of FIG. 7 may increase the sensing margin in a read operation by controlling the duration of the second period. For example, the control logic 330 may increase the sensing margin by increasing the duration of the second period to increase the extent of the development of the sensing voltage $V_{SN}$. In this case, the reference voltage $V_{REF}$ may vary depending on the duration of the second period.

As shown in FIG. 5, the resistance state of the memory cell MC may vary depending on data stored therein. For example, when data '0' is stored in the memory cell MC, the memory cell MC may be in the low resistance state RS1, and when data '1' is stored in the memory cell MC, the memory cell MC may be in the high resistance state RS2. Accordingly, the extent of the development for a sensing voltage $V_{SN1}$ of the sensing node SN when data '0' is stored in the memory cell MC may be greater than that of the development for a sensing voltage $V_{SN2}$ of the sensing node SN when data '1' is stored in the memory cell MC. As a result, the level of the sensing voltage $V_{SN1}$ may be greater than that of the sensing voltage $V_{SN2}$.

In a third period, the sense amplifier 426 may compare the sensing voltage $V_{SN}$ to the reference voltage $V_{REF}$ in response to the sensing enable signal SE and may output read data DOUT. In other words, data stored in the memory cell MC may be sensed as '0' by the sense amplifier 426 when the level of the sensing voltage $V_{SN}$ is greater than that of the reference voltage $V_{REF}$ (e.g., $V_{SN1}$), and may be sensed as '1' by the sense amplifier 426 when the level of the sensing voltage $V_{SN}$ is less than that of the reference voltage $V_{REF}$ (e.g., $V_{SN2}$). The circuit diagram shown in FIG. 8 is only an example of an implementation of a memory device, and the inventive concept is not limited thereto. The memory device may be implemented using various circuit configurations. According to exemplary embodiments of the inventive concept, a read circuit of the memory device 400 may be configured to read data of the memory cell MC by comparing the voltage $V_{CSN}$ (e.g., $V_{CSN1}$, $V_{CSN2}$) of the charge sharing node CSN to a predetermined reference voltage $V_{REF}$.

When an operation of reading data of the memory cell MC is completed, the control logic 330 of FIG. 7 may control the read circuit 320 and precharge the sensing node SN and the charge sharing node CSN to the ground voltage Vss.

Figure 10:
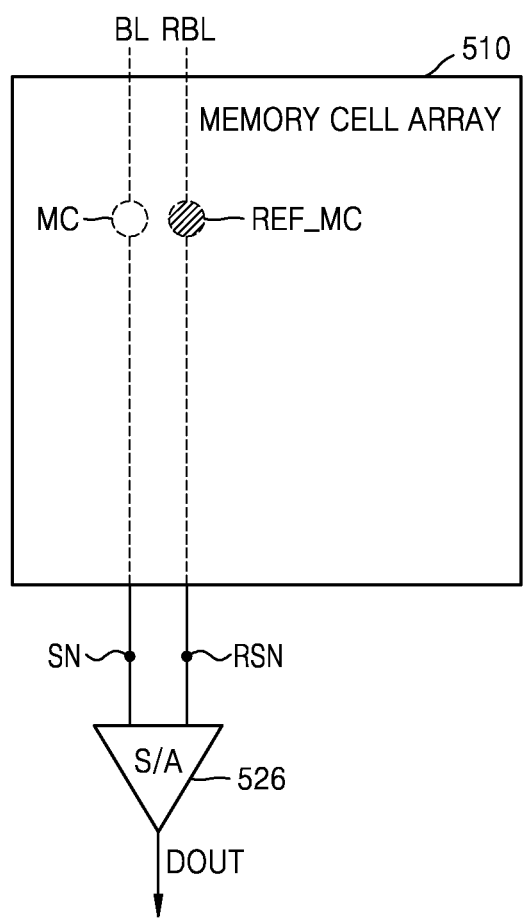
FIG. 10 is a block diagram for describing a read operation for a memory cell array including a reference memory cell, according to an exemplary embodiment of the inventive concept.

FIG. 10 is a block diagram for describing a read operation for a memory cell array 510 including a reference memory cell, according to an exemplary embodiment of the inventive concept.

Referring to FIG. 10, the memory cell array 510 includes a normal memory cell MC, which is a target of a read operation, and a reference memory cell REF_MC corresponding to the normal memory cell MC. A sense amplifier 526 may compare the sensing voltage of the sensing node SN connected to the bit line BL of the normal memory cell MC to a reference sensing voltage of a reference sensing node RSN connected to a reference bit line RBL of the reference memory cell REF_MC, and may output read data DOUT. The reference memory cell REF_MC may store data that is complementary to data stored in the normal memory cell MC. For example, assuming that 1-bit data is written in the normal memory cell MC, data '1' may be written in the normal memory cell MC and data '0' (e.g., complementary to '1') may be written in the reference memory cell REF_MC corresponding to the normal memory cell MC. Data stored in the normal memory cell MC may be read by comparing the sensing voltage of the sensing node SN to the reference sensing voltage of the reference sensing node RSN. The reference voltage $V_{REF}$ that is provided to the sense amplifier 326 of FIG. 7 may correspond to the reference sensing voltage of the reference sensing node RSN.

Figure 11:
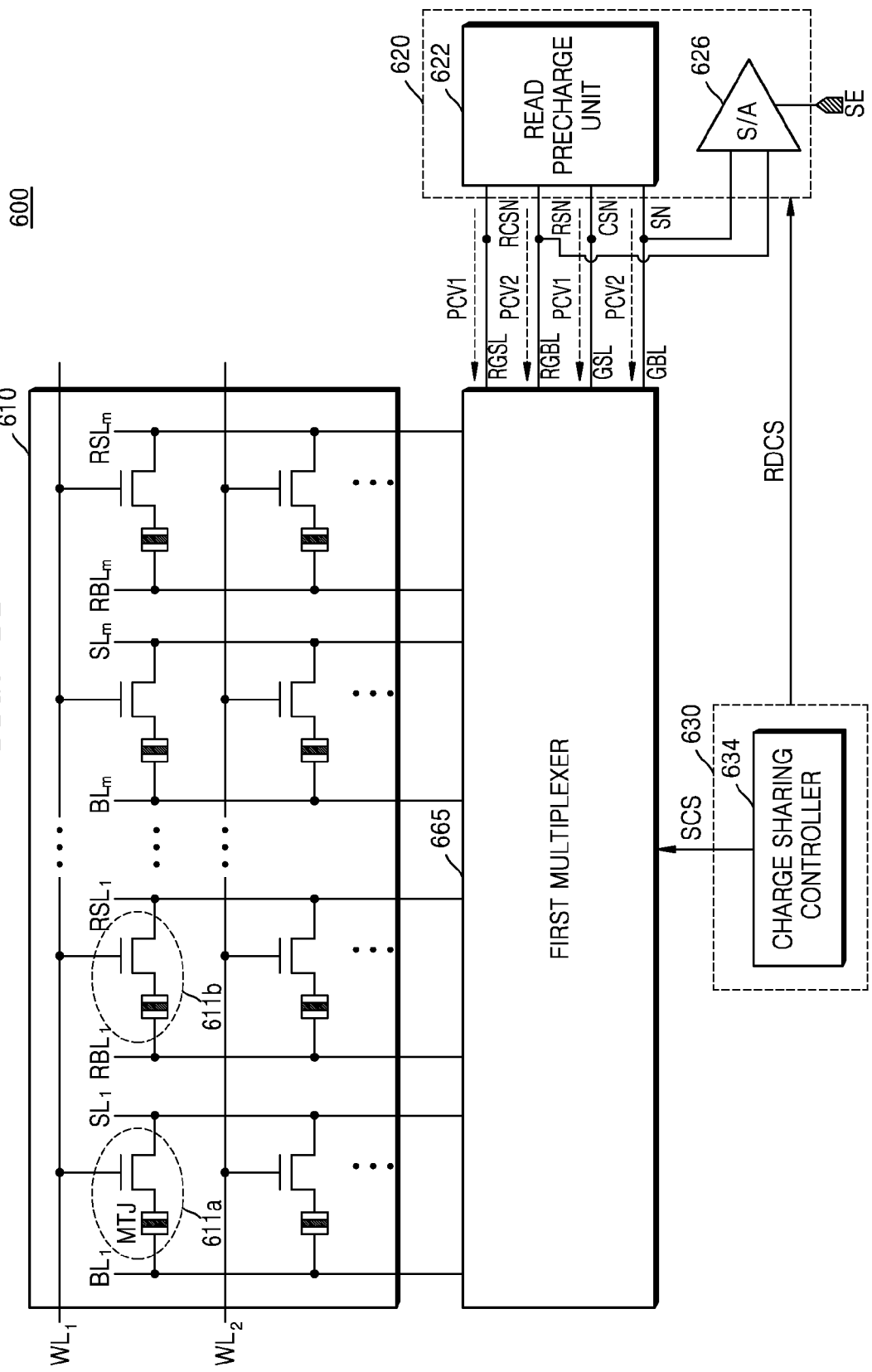
FIG. 11 is a block diagram of a memory device, which includes a memory cell array corresponding to the memory cell array of FIG. 10, for describing a read operation according to an exemplary embodiment of the inventive concept.

FIG. 11 is a block diagram of a memory device 600, which includes a memory cell array 610 corresponding to the memory cell array 510 of FIG. 10, for describing a read operation according to an exemplary embodiment of the inventive concept.

Referring to FIG. 11, the memory device 600 includes the memory cell array 610, a read circuit 620, and a first multiplexer 665. The memory cell array 610 includes the plurality of word lines WL1 to WLn (where n is a natural number that is greater than or equal to 1), the plurality of bit lines BL1 to BLm (where m is a natural number that is greater than or equal to 1), the plurality of source lines SL1 to SLm, and the plurality of memory cells arranged between the bit lines BL1 to BLm and the source lines SL1 to SLm. Each of the memory cells may correspond to the normal memory cell MC of FIG. 10. In addition, the memory cell array 610 includes a plurality of reference bit lines RBL1 to RBLm, a plurality of reference source lines RSL1 to RBLm, and a plurality of reference memory cells arranged between the reference bit lines RBL1 to RBLm and the reference source lines RSL1 to RSLm. Each of the reference memory cells may correspond to the reference memory cell REF_MC of FIG. 10. Each of the memory cells and each of the reference memory cells include a cell transistor and an MJT device. Each of the memory cells may be connected between one of the bit lines BL1 to BLm and one of the source lines SL1 to SLm, and each of the reference memory cells may be connected between one of the reference bit lines RBL1 to RBLm and one of the reference source lines RSL1 to RSLm.

Hereinafter, the description will assume that a reference memory cell 611b, which includes a cell transistor connected to the first word line WL1 and is between the first reference bit line RBL1 and the first reference source line RSL1, corresponds to a memory cell 611a, which includes a cell transistor connected to the first word line WL1 and is between the first bit line BL1 and the first source line SL1.

The first multiplexer 665 includes a plurality of switching devices for connecting the bit lines BL1 to BLm to the global bit line GBL, a plurality of switching devices for connecting the reference bit lines RBL1 to RBLm to a reference global bit line RGBL, a plurality of switching devices for connecting the source lines SL1 to SLm to the global source line GSL, and a plurality of switching devices for connecting the reference source lines RSL1 to RSLm to a reference global source line RGSL.

Hereinafter, the sensing node SN is a node at which any one of the bit lines BL1 to BLm is connected to the global bit line GBL, and a reference sensing node RSN is a node at which any one of the reference bit lines RBL1 to RBLm is connected to the reference global bit line RGBL. In addition, the charge sharing node CSN is a node at which any one of the source lines SL1 to SLm is connected to the global source line GSL, and a reference charge sharing node RCSN is a node at which any one of the reference source lines RSL1 to RSLm is connected to the reference global source line RGSL.

The read circuit 620 includes a read precharge unit 622 and a sense amplifier 626. Before the read circuit 620 performs a read operation, the sensing node SN, the reference sensing node RSN, the charge sharing node CSN, and the reference charge sharing node RCSN may be precharged to a voltage having a predetermined level. In the present exemplary embodiment, it is assumed that this voltage is the ground voltage Vss. The switching devices of the first multiplexer 665 may be in a turn-off state. During a first period, the read precharge unit 622 may precharge the sensing node SN to the second pre-charge voltage PCV2 via the global bit line GBL and precharge the reference sensing node RSN to the second precharge voltage PCV2 via the reference global bit line RGBL. In addition, the read precharge unit 622 may precharge the charge sharing node CSN to the first pre-charge voltage PCV1 via the global source line GSL and precharge the reference charge sharing node RCSN to the first precharge voltage PCV1 via the reference global source line RGSL.

In an exemplary embodiment of the inventive concept, the level of the first precharge voltage PCV1 may be different from that of the second precharge voltage PCV2. Hereinafter, details are described under an assumption that the level of the first precharge voltage PCV1 is greater than that of the second precharge voltage PCV2. The first period may be a read precharge period.

When the sensing node SN and the reference sensing node RSN are precharged to the second precharge voltage PCV2 and the charge sharing node CSN and the reference charge sharing node RCSN are precharged to the first precharge voltage PCV1, a charge sharing controller 634 may provide the selection control signal SCS to the first multiplexer 665 during a second period so that some switching devices of the first multiplexer 365 are turned on during the second period. Thus, the sensing voltage of the sensing node SN and a reference sensing voltage of the reference sensing node RSN may be developed. For example, the memory cell 611a connected to the first bit line BL1 and the first source line SL1 may be selected as a target memory cell of a read operation, and the reference memory cell 611b may be selected to read data of the memory cell 611a. During the second period, the charge sharing controller 634 may turn on a switching device connected to the first bit line BL1, a switching device connected to the first reference bit line RBL1, a switching device connected to the first source line SL1, and a switching device connected to the first reference source line RSL1, from among the switching devices of the first multiplexer 665, and thus, a development operation may be performed. Due to a potential difference between the sensing node SN and the charge sharing node CSN, which occurs due to a read precharge operation, a charge sharing phenomenon may occur in which a current flows in the memory cell 611a from the first source line SL1 toward the first bit line BL1. In addition, due to a potential difference between the reference sensing node RSN and the reference charge sharing node RCSN, which occurs due to the read precharge operation, a charge sharing phenomenon may occur in which a current flows in the reference memory cell 611b from the first reference source line RSL1 toward the first reference bit line RBL1. In this case, the amount of current flowing in the memory cell 611a may vary depending on a resistance level of the MJT device included in the memory cell 611a, and the amount of current flowing in the reference memory cell 611b may vary depending on a resistance level of the MJT device included in the reference memory cell 611b. Through such control of the first multiplexer 665 by the charge sharing controller 634, the sensing voltage of the sensing node SN connected to the memory cell 611a and the reference sensing voltage of the reference sensing node RSN connected to the reference memory cell 611b may be developed to higher levels. The second period may be referred to as the development period.

Next, during a third period, the sense amplifier 626 may be activated in response to the sensing enable signal SE, and may compare the sensing voltage of the sensing node SN to the reference sensing voltage of the reference sensing node RSN, and may output data DOUT stored in the memory cell 611a. The third period may be referred to as the sensing period.

Although it has been assumed that the memory cell 611a is selected as a target of a read operation, the inventive concept is not limited thereto. For example, the read precharge operation, the development operation, and the sensing operation, as described above, may also be performed when another memory cell is selected as a target of a read operation.

Figure 12:
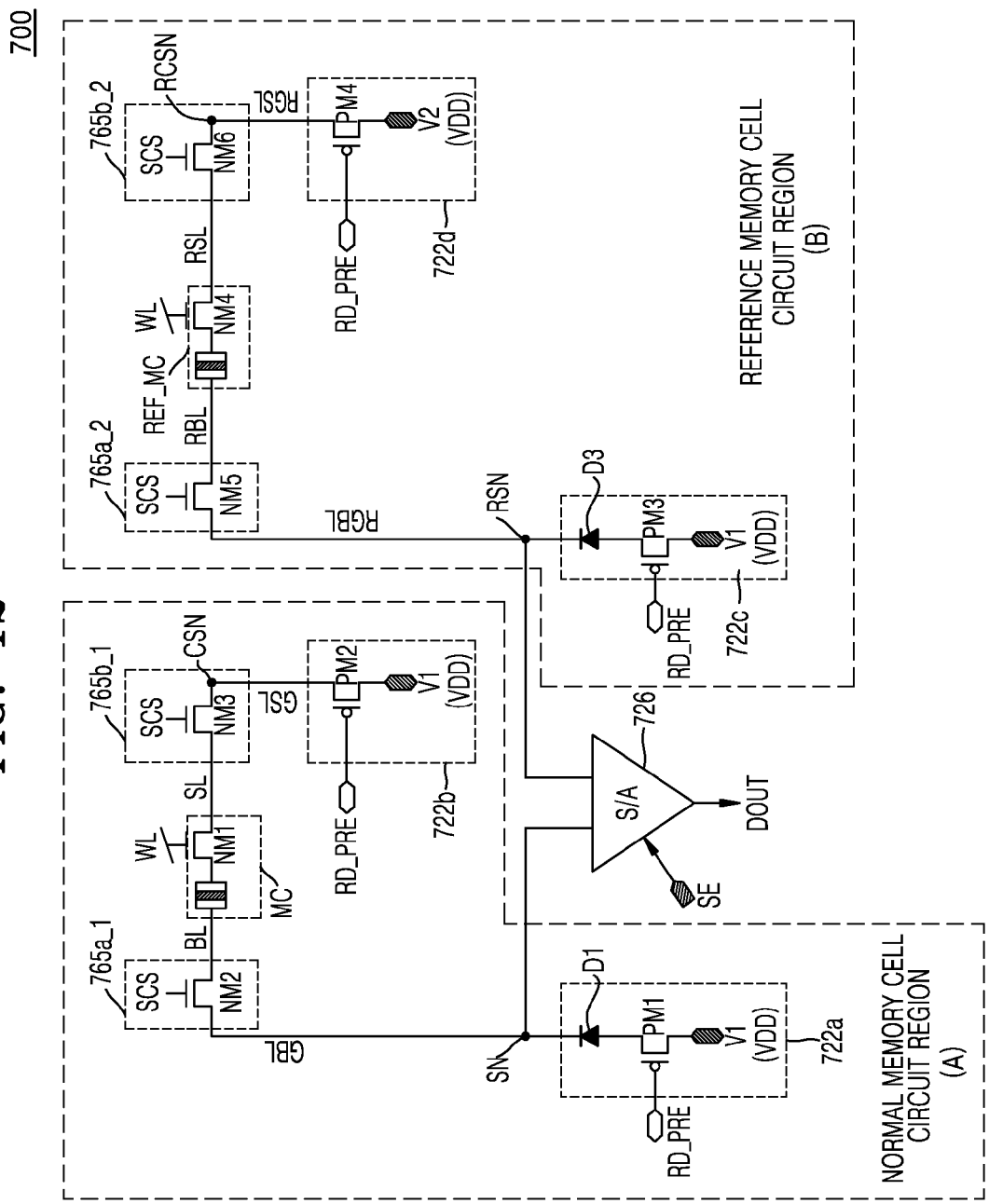
FIG. 12 is a detailed circuit diagram of the memory device illustrated in FIG. 11 according to an exemplary embodiment of the inventive concept.
Figure 13A:
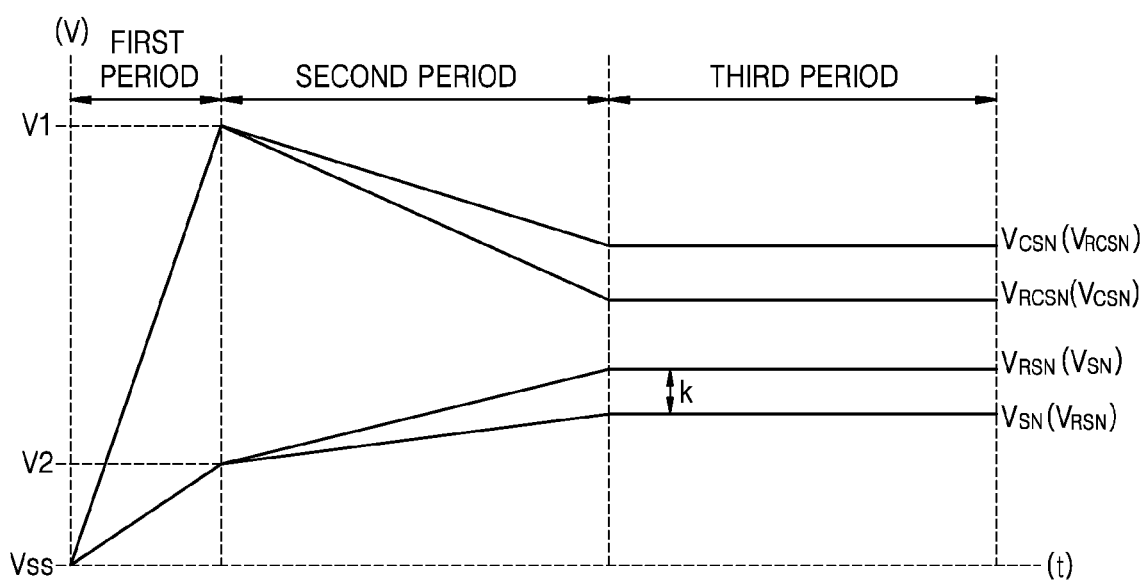
FIGS. 13A and 13B are graphs illustrating a method of performing a read operation of the memory device of FIG. 12 according to an exemplary embodiment of the inventive concept.
Figure 13B:
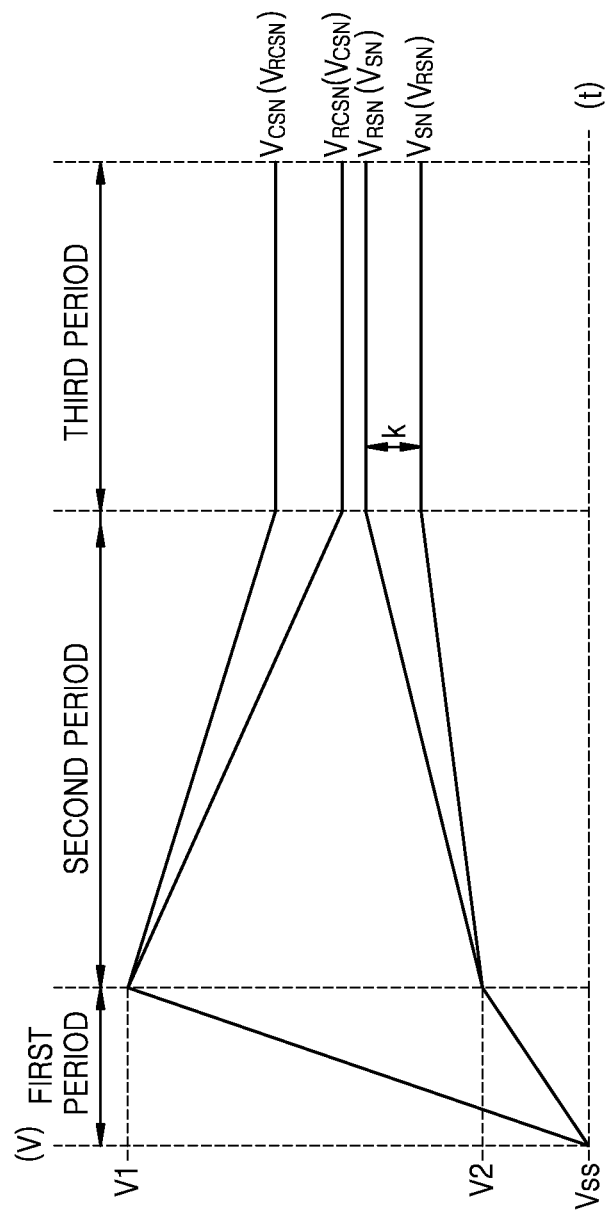

FIG. 12 is a detailed circuit diagram of a memory device 700 corresponding to the memory device 600 illustrated in FIG. 11 according to an exemplary embodiment of the inventive concept. FIGS. 13A and 13B are graphs illustrating a method of performing a read operation of the memory device 700 of FIG. 12 according to an exemplary embodiment of the inventive concept.

Referring to FIG. 12, the memory device 700 includes a normal memory cell circuit region A including the memory cell MC selected as a target of a read operation and a reference memory cell circuit region B including the reference memory cell REF_MC corresponding to the memory cell MC. The memory cell MC may include a selection transistor NM1. The normal memory cell circuit region A further includes a first read precharge unit 722a, a second read precharge unit 722b, a first switching device 765a_1, and a second switching device 765b_1. The first read precharge unit 722a includes a selection transistor PM1 and a diode D1. The selection transistor PM1 may be connected to a power voltage V1 node in response to a read precharge enable signal RD_PRE. The second read precharge unit 722b includes a selection transistor PM2. The selection transistor PM2 may be connected to the power voltage V1 node in response to the read precharge enable signal RD_PRE. The first switching device 765a_1 may include a selection transistor NM2, and a bit line BL of the memory cell MC may be connected to a global bit line GBL, which is connected to a sense amplifier 726, through the selection transistor NM2 in response to the selection control signal SCS provided from the charge sharing controller 634 of FIG. 11. The second switching device 765b_1 may include a selection transistor NM3, and a source line SL of the memory cell MC may be connected to a global source line GSL through the selection transistor NM3 in response to the selection control signal SCS provided from the charge sharing controller 634 of FIG. 11. The first and second switching devices 765a_1 and 765b_1 and third and fourth switching devices 765a_2 and 765b_2 may be switching devices included in the first multiplexer 665 of FIG. 11.

A circuit configuration of the reference memory cell circuit region B may be substantially the same as that of the normal memory cell circuit region A. For example, the reference memory cell circuit region B includes a third read precharge unit 722c, a fourth read precharge unit 722d, a third switching device 765a_2, and a fourth switching device 765b_2. The reference memory cell REF_MC may include a selection transistor NM4. The third read precharge unit 722c includes a selection transistor PM3 and a diode D3. The selection transistor PM3 may be connected to the power voltage V1 node in response to the read precharge enable signal RD_PRE. The fourth read precharge unit 722d includes a selection transistor PM4. The selection transistor PM4 may be connected to the power voltage V1 node in response to the read precharge enable signal RD_PRE. The third switching device 765a_2 may include a selection transistor NM5, and a reference bit line RBL of the reference memory cell REF_MC may be connected to a reference global bit line RGBL through the selection transistor NM5 in response to the selection control signal SCS provided from the charge sharing controller 634 of FIG. 11. The fourth switching device 765b_2 may include a selection transistor NM6, and a reference source line RSL of the reference memory cell REF_MC may be connected to a reference global source line RGSL through the selection transistor NM6 in response to the selection control signal SCS provided from the charge sharing controller 634 of FIG. 11.

Referring to FIGS. 12 and 13A, during a first period, the first read precharge unit 722a of the normal memory cell region A may precharge the sensing node SN of the global bit line GBL from the level of the ground voltage Vss to the level of the second voltage V2, in response to the read precharge enable signal RD_PRE at a logic low level. In an exemplary embodiment of the inventive concept, the second voltage V2 may correspond to a voltage obtained by subtracting a threshold voltage of the diode D1 from the first voltage V1. Additionally, during the first period, the second read precharge unit 722b may precharge the charge sharing node CSN of the global source line GSL from the level of the ground voltage Vss to the level of the first voltage V1, in response to the read precharge enable signal RD_PRE at a logic low level. The first voltage V1 may correspond to the power voltage $V_{DD}$ supplied from the voltage generator 140 of FIG. 2. When the read precharge operation as described above is performed, the selection transistor NM2 of the first switching device 765a_1 and the selection transistor NM3 of the second switching device 765b_1 may be in a turn-off state. As a result, the sensing node SN and the charge sharing node CSN may be precharged to different voltage levels by the first read precharge unit 722a and the second read precharge unit 722b, respectively.

In addition, a circuit structure of the reference memory cell circuit region B may be substantially the same as that of the normal memory cell circuit region A. Thus, as in the normal memory cell circuit region A, the reference sensing node RSN and the reference charge sharing node RCSN may be precharged to the level of the second voltage V2 and the level of the first voltage V1 by the third read precharge unit 722c and the fourth read precharge unit 722d, respectively.

In a second period, the selection transistors NM2, NM3, NM5, and NM6 of the switching devices 765a_1, 765a_2, 765b_1, and 765b_2 of the first multiplexer 665 may be turned on in response to the selection control signal SCS at a logic high level, which is received from the charge sharing controller 634 of FIG. 11. Since the charge sharing node CSN and the reference charge sharing node RCSN are in a state in which they have been precharged to the level of the first voltage V1 and the sensing node SN and the reference sensing node RSN are in a state in which they have been precharged to the level of the second voltage V2, current may flow from the source line SL of the memory cell MC toward the bit line BL thereof and from the reference source line RSL of the reference memory cell REF_MC toward the reference bit line RBL thereof due to potential differences between the nodes.

Accordingly, in the second period, the sensing voltage $V_{SN}$ of the sensing node SN and a reference sensing voltage $V_{RSN}$ of the reference sensing node RSN may be developed to increase, and the voltage $V_{CSN}$ of the charge sharing node CSN and a voltage $V_{RCN}$ of the reference charge sharing node RCSN may be developed to decrease. In this case, the extent of the development of the sensing voltage $V_{SN}$ of the sensing node SN and the extent of the development of the reference sensing voltage $V_{RSN}$ of the reference sensing node RSN may be changed depending on a resistance level of the MTJ device of the memory cell MC and a resistance level of the MTJ device of the reference memory cell REF_MC, respectively. Hereinafter, for convenience of description, the resistance level of the MTJ device is referred to as a resistance level of the memory cell MC.

As shown in FIG. 5, a resistance state of the memory cell MC may vary depending on data stored therein. For example, when data '0' is stored in the memory cell MC, the memory cell MC may be in the low resistance state RS1, and when data '1' is stored in the memory cell MC, the memory cell MC may be in the high resistance state RS2. As described with reference to FIG. 10, first data is written in the memory cell MC and second data, which is complementary to the first data, is written in the reference memory cell REF_MC. When the first and second data are written during a program operation, the extent of the development for the sensing voltage $V_{SN}$ of the sensing node SN and the extent of the development for the reference sensing voltage $V_{RSN}$ of the reference sensing node RSN may be controlled to be different from each other by the development operation performed in the second period. For example, during a program operation, data '0' is written in the reference memory cell REF_MC to correspond to the memory cell MC, in which data '1' is written. As discussed above, in the second period, the extent of the development for the sensing voltage $V_{SN}$ of the sensing node SN may be less than that of the development for the reference sensing voltage $V_{RSN}$ of the reference sensing node RSN. As a result, when a read operation is performed after the program operation, the level of the sensing voltage $V_{SN}$ may be less than that of the reference sensing voltage $V_{RSN}$. In this manner, the extent of a sensing margin K for reading data of the memory cell MC may be increased. In addition, through a read operation that may increase the extent of the sensing margin K of the memory device 700, a development period may be reduced and thus, read operation speed may be increased.

In a third period, the sense amplifier 726 may compare the sensing voltage $V_{SN}$ to the reference sensing voltage $V_{RSN}$ in response to the sensing enable signal SE and may output read data DOUT. For example, data stored in the memory cell MC may be sensed as '1' by the sense amplifier 726 when the level of the sensing voltage $V_{SN}$ is less than that of the reference sensing voltage $V_{RSN}$, and may be sensed as '0' by the sense amplifier 726 when the level of the sensing voltage $V_{SN}$ is greater than that of the reference sensing voltage $V_{RSN}$.

When an operation to read data of the memory cell MC is completed, the sensing node SN, the reference sensing node RSN, the charge sharing node CSN, and the reference charge sharing node RCSN may be precharged to the ground voltage Vss.

Referring to FIGS. 11 and 13B, a control logic 630 may increase the sensing margin in a read operation by controlling the duration of the second period. For example, the control logic 630 may increase the duration of the second period. Accordingly, the extent of the development for the sensing voltage $V_{SN}$ and the extent of the development for the reference sensing voltage $V_{RSN}$ may further increase. As a result, the difference between the sensing voltage $V_{SN}$ and the reference sensing voltage $V_{RSN}$ in the third period is larger in FIG. 13B than in FIG. 13A, and thus, a sensing margin K' may be further increased (compared to the sensing margin K in FIG. 13A). In an exemplary embodiment of the inventive concept, the control logic 630 may determine the duration of the second period based on the operational environment of the memory device 700. Furthermore, the control logic 630 may receive a control signal from the memory controller 200 of FIG. 1 or a control logic of the memory device 700, and control the duration of the second period in response to the control signal. For example, when the operational environment of the memory device 700 is poor and thus data reliability is deteriorated, the control logic 630 may increase the duration of the second period to increase data reliability.

The circuit diagram shown in FIG. 12 is only an implementation example of a memory device according to an exemplary embodiment of the inventive concept. The inventive concept is not limited thereto, and the memory device may be implemented using various circuit configurations.

For example, a read circuit of the memory device 700 may be configured to read data of the memory cell MC by comparing the voltage $V_{CSN}$ of the charge sharing node CSN to the voltage $V_{RCSN}$ of the reference charge sharing node RCSN.

Figure 14:
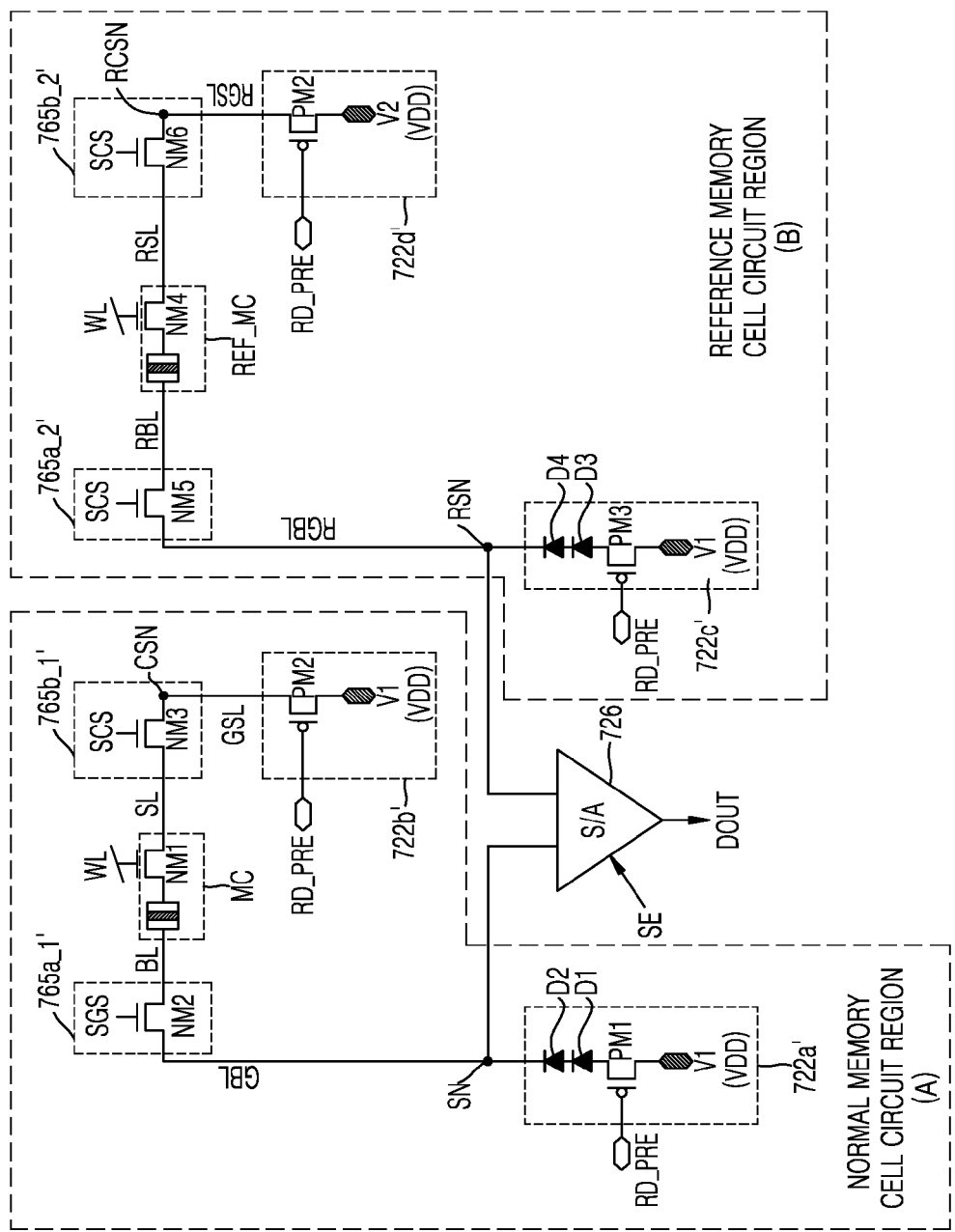
FIG. 14 is a detailed circuit diagram of a memory device according to an exemplary embodiment of the inventive concept.
Figure 15:
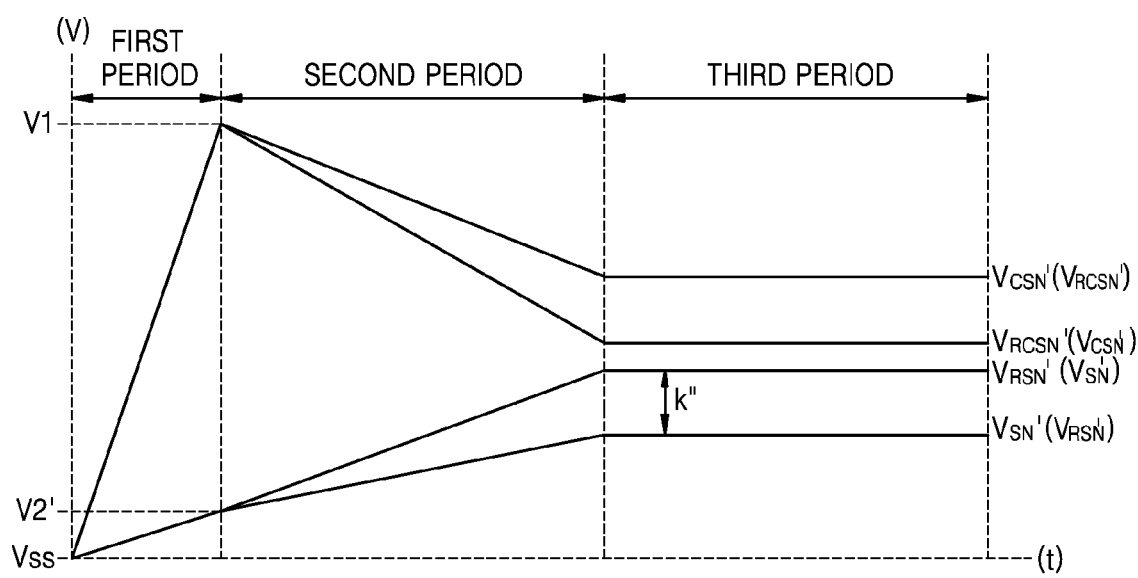
FIG. 15 is a graph illustrating a method of performing a read operation of the memory device of FIG. 14 according to an exemplary embodiment of the inventive concept.

FIG. 14 is a detailed circuit diagram of a memory device 700' according to an exemplary embodiment of the inventive concept. FIG. 15 is a graph illustrating a method of performing a read operation of the memory device 700' of FIG. 14 according to an exemplary embodiment of the inventive concept.

Referring to FIG. 14, the memory device 700' is substantially the same as the memory device 700 of FIG. 12. For example, first to fourth read precharge units 722a' to 722d' and first to fourth switching devices 765a_1' to 765b_2' of FIG. 14 substantially correspond to first to fourth read precharge units 722a to 722d and first to fourth switching devices 765a_1 to 765b_2, respectively, of FIG. 12. However, the first read precharge unit 722a' further includes a diode D2 (as compared to the first read precharge unit 722a of FIG. 12), and the third read precharge unit 722c' further includes a diode D4 (as compared to the third read precharge unit 722c of FIG. 12). In other words, the first read precharge unit 722a' of the memory device 700' includes more diodes than the first read precharge unit 722a of FIG. 12, and the third read precharge unit 722c' of the memory device 700' includes more diodes than the third read precharge unit 722c of FIG. 12.

Referring to FIGS. 14 and 15, the first read precharge unit 722a' and the third read precharge unit 722c' may precharge the sensing node SN and the reference sensing node RSN to a second voltage V2', which is obtained by subtracting the sum of threshold voltages of two diodes (e.g., the diodes D1 and D2) from a first voltage V1 and thus is lower than the second voltage V2 of FIG. 13A, during a first period. In this manner, by increasing a difference between the level of the first voltage V1 and the level of the second voltage V2', the difference between the extent of the development for a sensing voltage $V_{SN}'$ of the sensing node SN and the extent of the development for a reference sensing voltage $V_{RSN}'$ of the reference sensing node RSN during a second period may be larger than in FIG. 13A. Furthermore, the difference between the extent of the development for a voltage $V_{CSN}'$ of the charge sharing node CSN and the extent of the development for a voltage $V_{RCSN}'$ of the reference charge sharing node RCSN during a second period may be larger than in FIG. 13A. Accordingly, the difference between the level of the sensing voltage $V_{SN}'$ and the level of the reference sensing voltage $V_{RSN}'$ may increase during a third period, and thus, a sensing margin k" may be increased. Consequently, the memory device 700', according to the present exemplary embodiment, may further increase the sensing margin in a read operation by increasing the difference between the level of the first voltage V1 (for the precharge of the charge sharing node CSN and the reference charge sharing node RCSN) and the level of the second voltage V2' (for the precharge of the sensing node SN and the reference sensing node RSN). Although each of the first and third read precharge units 722a' and 722c' of FIG. 14 includes two diodes, the inventive concept is not limited thereto. For example, each of the first and third read precharge units 722a' and 722c' may include two or more diodes. Alternatively, each of the first and third read precharge units 722a' and 722c' do not include a diode and may include a terminal for receiving the second voltage V2' having a level that is lower than that of the first voltage V1.

Figure 16:
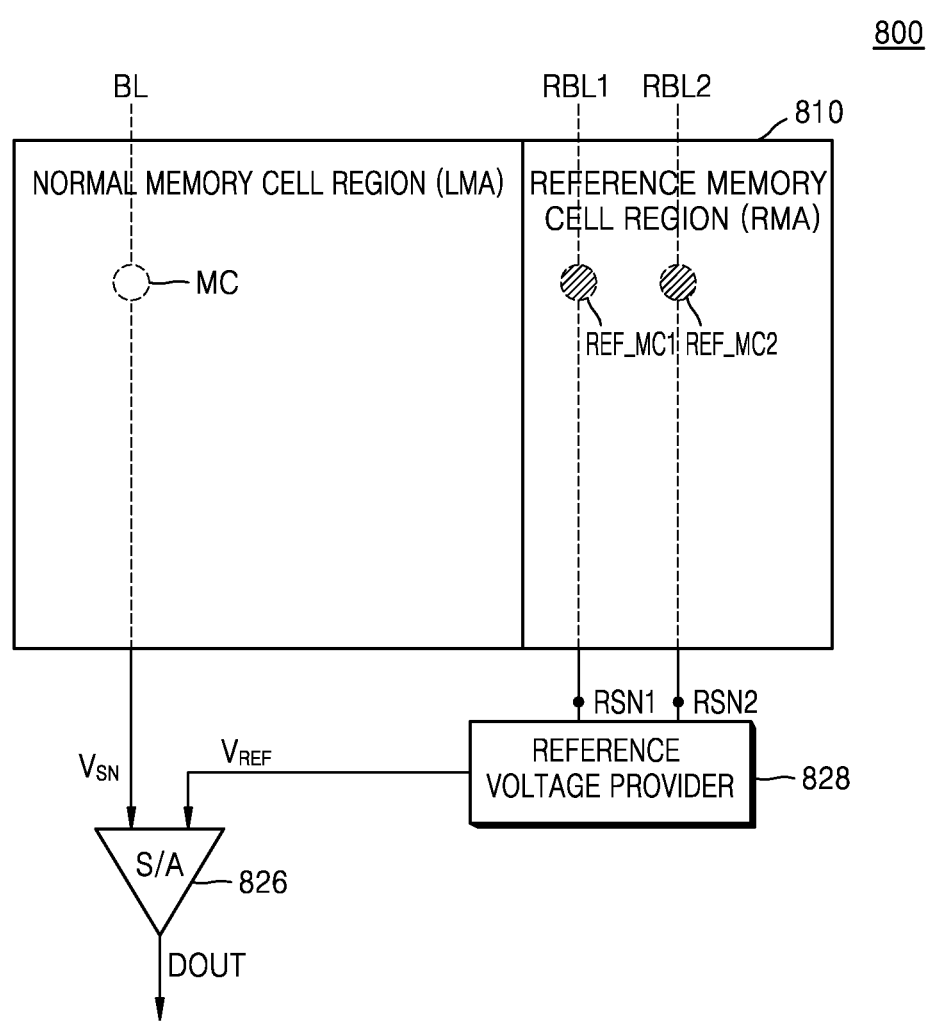
FIG. 16 is a block diagram for describing a read operation for a memory cell array including a reference memory cell region for generating a reference voltage, according to an exemplary embodiment of the inventive concept.

FIG. 16 is a block diagram for describing a read operation for a memory cell array 810 including a reference memory cell region for generating a reference voltage, according to an exemplary embodiment of the inventive concept.

Referring to FIG. 16, the memory cell array 810 includes a normal memory cell region LMA including a normal memory cell MC that is a target of a read operation, and a reference memory cell region RMA including a plurality of reference memory cells REF_MC1 and REF_MC2 for generating a reference voltage.

Furthermore, a memory device 800 including the memory cell array 810 may further include a reference voltage provider 828. The reference voltage provider 828 may generate a reference voltage $V_{REF}$ by using reference sensing voltages sensed at reference sensing nodes RSN1 and RSN2 of reference bit lines RBL1 and RBL2 connected to the reference memory cells REF_MC1 and REF_MC2. The reference voltage provider 828 may provide the generated reference voltage $V_{REF}$ to a sense amplifier 826.

The sense amplifier 826 may compare a sensing voltage $V_{SN}$, sensed from a sensing node of a bit line BL connected to the normal memory cell MC, to the reference voltage $V_{REF}$ and output read data DOUT. For example, when 1-bit data is written in the normal memory cell MC, as in FIG. 5, data '1' may have been previously stored in the first reference memory cell REF_MC1 and data '0' may have been previously stored in the second reference memory cell REF_MC2, and the reference voltage provider 828 may generate an average value of reference sensing voltages, sensed at the reference sensing nodes RSN1 and RSN2, as the reference voltage $V_{REF}$ and provide the generated reference voltage $V_{REF}$ to the sense amplifier 826.

However, the inventive concept is not limited thereto. For example, when the normal memory cell MC is a multi-level cell programmed with 2 bits, as in FIG. 6, the reference memory cell region RMA may include at least four reference memory cells, and the reference voltage provider 828 may generate the reference voltages $V_{REF1}$, $V_{REF2}$, and $V_{REF3}$, as shown in FIG. 6 by, using reference sensing voltages of reference sensing nodes of reference bit lines connected to the reference memory cells.

Figure 17:
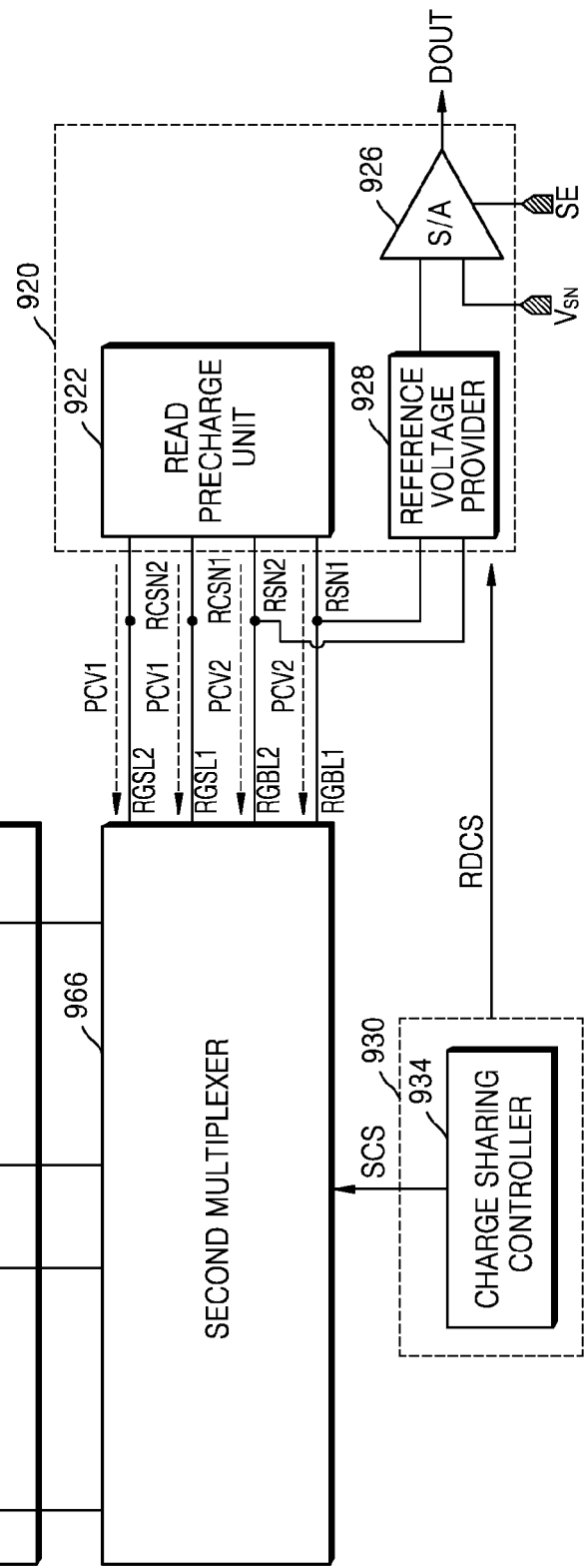
FIG. 17 is a block diagram of a memory device, which includes the memory cell array of FIG. 16, for describing a method of generating a reference voltage during a read operation according to an exemplary embodiment of the inventive concept.

FIG. 17 is a block diagram of a memory device 900, which includes the memory cell array of FIG. 16, for describing a method of generating a reference voltage during a read operation according to an exemplary embodiment of the inventive concept.

Referring to FIG. 17, the memory device 900 includes a memory cell array 910, a read circuit 920, and a second multiplexer 966. The memory cell array 910 includes the reference memory cell region RMA as shown in FIG. 16. The memory cell array 910 illustrated in FIG. 17 may correspond to the reference memory cell region RMA of FIG. 16. The reference memory cell region RMA may include the plurality of word lines WL1 to WLn, the plurality of reference bit lines RBL1 to RBLm, the plurality of reference source lines RSL1 to RSLm, and a plurality of reference memory cells arranged between the reference bit lines RBL1 to RBLm and the reference source lines RSL1 to RSLm. The reference memory cells may correspond to the reference memory cells REF_MC1 and REF_MC2 of FIG. 16. Each of the reference memory cells includes a cell transistor and an MJT device. Each of the reference memory cells may be connected between one of the reference bit lines RBL1 to RBLm and one of the reference source lines RSL1 to RSLm.

The second multiplexer 966 includes a plurality of switching devices for connecting the reference bit lines RBL1 to RBLm to reference sensing nodes RSN1 and RSN2 of reference global bit lines RGBL1 and RGBL2, and a plurality of switching devices for connecting the reference source lines RSL1 to RSLn to reference charge sharing nodes RCSN1 and RCSN2 of reference global source lines RGSL1 and RGSL2. According to an exemplary embodiment of the inventive concept, the column decoder 160 of FIG. 2 may include the first multiplexer 365 of FIG. 7 and the second multiplexer 966 of FIG. 17.

The read circuit 920 includes a read precharge unit 922, a sense amplifier 926, and a reference voltage provider 928. Before the read circuit 920 performs a read operation, a first reference sensing node RSN1, a second reference sensing node RSN2, a first reference charge sharing node RCSN1, and a second reference charge sharing node RCSN2 may be precharged to the ground voltage Vss and the switching devices of the second multiplexer 966 may be turned off. In an exemplary embodiment of the inventive concept, at least one of the plurality of reference memory cells of the reference memory cell region RMA may be selected to generate a reference voltage. Hereinafter, it is assumed that a first reference bit line RBL1, connected to a first reference memory cell 911a, and a second reference bit line RBL2, connected to a second reference memory cell 911b, are selected to generate a reference voltage. During a first period, the read precharge unit 922 may precharge the reference sensing nodes RSN1 and RSN2 of the reference global bit lines RGBL1 and RGBL2 to a second precharge voltage PCV2. In addition, during the first period, the read precharge unit 922 may precharge the reference charge sharing nodes RCSN1 and RCSN2 of the reference global source lines RGSL1 and RGSL2 to a first precharge voltage PCV1. The number of reference global bit lines RGBL and the number of reference global source lines RGSL may be changed depending on the number of reference memory cells necessary to generate a reference voltage. For example, when one reference voltage is necessary to read a memory cell storing 1-bit data and the number of reference memory cells necessary to generate the one reference voltage is two, the number of reference global bit lines RGBL and the number of reference global source lines RGSL may each be two. Furthermore, when the number of reference voltages necessary to read a memory cell storing 2-bit data is three and the number of reference memory cells necessary to generate three reference voltages is four, the number of reference global bit lines RGBL and the number of reference global source lines RGSL may each be four.

Hereinafter, the description will assume that the level of the first precharge voltage PCV1 is greater than that of the second precharge voltage PCV2. The first period may be referred to as a read precharge period.

After the reference sensing nodes RSN1 and RSN2 are precharged to the level of the second precharge voltage PCV2 and the reference charge sharing nodes RCSN1 and RCSN2 are precharged to the level of the first precharge voltage PCV1, the charge sharing controller 934 may control the second multiplexer 966 by providing the selection control signal SCS to the second multiplexer 966 during a second period, based on selected reference memory cells 911a and 911b. The charge sharing controller 934 may develop reference sensing voltages of the reference sensing nodes RSN1 and RSN2 connected to the selected reference memory cells 911a and 911b, through a control for the second multiplexer 966.

For example, when reference memory cells selected to generate a reference voltage are the first and second reference memory cells 911a and 911b, the charge sharing controller 934 may control a development operation by turning on a switching device connected to the first reference bit line RBL1, a switching device connected to the second reference bit line RBL2, a switching device connected to the first reference source line RSL1, and a switching device connected to the second reference source line RSL2, from among the switching devices of the second multiplexer 966, during the second period. Due to a potential difference between the reference sensing node RSN1 and the reference charge sharing node RCSN1 and a potential difference between the reference sensing node RSN2 and the reference charge sharing node RCSN2, which occurs due to a read precharge operation, a first current may flow in the reference memory cell 911a from the first reference source line RSL1 toward the first reference bit line RBL1, and a second current may flow in the reference memory cell 911b from the second reference source line RSL2 toward the second reference bit line RBL2. In this case, the amount of the first current may vary depending on a resistance level of an MJT device included in the reference memory cell 911a, and the amount of the second current may vary depending on a resistance level of an MJT device included in the reference memory cell 911b.

Through such an operation of the charge sharing controller 934, a reference sensing voltage of the reference sensing node RSN1 connected to the reference memory cell 911a and a reference sensing voltage of the reference sensing node RSN2 connected to the reference memory cell 911b may be developed and increase. The second period may be referred to as a sensing voltage development period.

The charge sharing controller 934 may provide the selection control signal SCS to the second multiplexer 966, and thus may control the second multiplexer 966 and complete a development operation for a sensing voltage. For example, the charge sharing controller 934 may complete the development operation by turning off the switching device connected to the first reference bit line RBL1, the switching device connected to the second reference bit line RBL2, the switching device connected to the first reference source line RSL1, and the switching device connected to the second reference source line RSL2, from among the switching devices of the second multiplexer 966. Next, during a third period, the sense amplifier 926 may be activated in response to the sensing enable signal SE and may compare a sensing voltage $V_{SN}$ of a sensing node SN, connected to a memory cell corresponding to a read target, to a reference voltage $V_{REF}$ generated from the reference memory cell region RMA, as described with reference to FIG. 7, and output data DOUT stored in the memory cell. The third period may be referred to as a sensing period.

Figure 18:
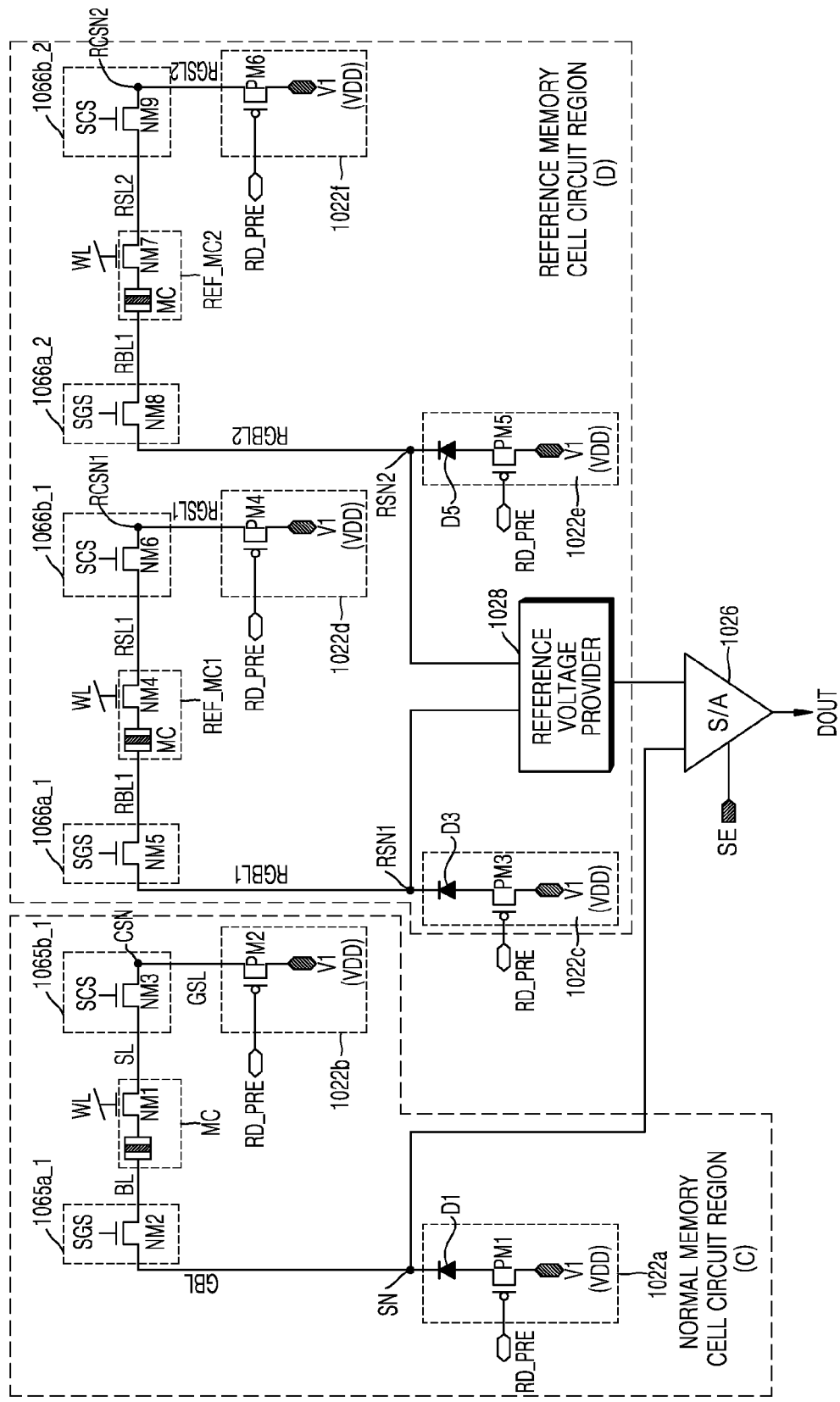
FIG. 18 is a detailed circuit diagram of the memory device illustrated in FIG. 17 according to an exemplary embodiment of the inventive concept.

FIG. 18 is a circuit diagram of a memory device 1000 corresponding to the memory device 900 illustrated in FIG. 17 according to an exemplary embodiment of the inventive concept.

Referring to FIG. 18, the memory device 1000 includes a normal memory cell circuit region C including a memory cell MC selected as a target of a read operation and a reference memory cell circuit region D including reference memory cells REF_MC1 and REF_MC2 for the generation of a reference voltage. The normal memory cell circuit region C includes a first read precharge unit 1022a, a second read precharge unit 1022b, a first switching device 1065a_1, and a second switching device 1065b_1. The first read precharge unit 1022a includes a selection transistor PM1 and a diode D1. The selection transistor PM1 may be connected to a power voltage V1 node in response to a read precharge enable signal RD_PRE. The second read precharge unit 1022b includes a selection transistor PM2. The selection transistor PM2 may be connected to the power voltage V1 node in response to the read precharge enable signal RD_PRE. The first switching device 1065a_1 may include a selection transistor NM2, and a bit line BL of the memory cell MC may be connected to a global bit line GBL, which is connected to a sense amplifier 1026, through the selection transistor NM1 in response to the selection control signal SCS provided from the charge sharing controller 934 of FIG. 17. The second switching device 1065b_1 may include a selection transistor NM3, and a source line SL of the memory cell MC may be connected to a global source line GSL, which is connected to the second read precharge unit 1022b, through the selection transistor NM3 in response to the selection control signal SCS provided from the charge sharing controller 934 of FIG. 17.

As described above, the normal memory cell circuit region C includes the first read precharge unit 1022a, the second read precharge unit 1022b, the first switching device 1065a_1, and the second switching device 1065b_1. The reference memory cell circuit region D includes third to sixth read precharge units 1022c to 1022f and third to sixth switching devices 1066a_1, 1066b_1, 1066a_2, and 1066b_2. The normal memory cell circuit region C may have substantially the same circuit configuration as the memory device 400 shown in FIG. 8. According to an exemplary embodiment of the inventive concept, the third to sixth switching devices 1066a_1, 1066b_1, 1066a_2, and 1066b_2 may be the switching devices of the second multiplexer 966 of FIG. 17.

The third read precharge unit 1022c includes a selection transistor PM3 and a diode D3. The selection transistor PM3 may be connected to the power voltage V1 node in response to the read precharge enable signal RD_PRE. The fourth read precharge unit 1022d includes a selection transistor PM4. The selection transistor PM4 may be connected to the power voltage V1 node in response to the read precharge enable signal RD_PRE. The third switching device 1066a_1 may include a selection transistor NM5, and a reference bit line RBL1 of the first reference memory cell REF_MC1 may be connected to a reference global bit line RGBL1, which is connected to a sense amplifier 1026, through the selection transistor NM5 in response to the selection control signal SCS provided from the charge sharing controller 934 of FIG. 17. The fourth switching device 1066b_1 may include a selection transistor NM6, and a reference source line RSL1 of the first reference memory cell REF_MC1 may be connected to a reference global source line RGSL1, which is connected to the fourth read precharge unit 1022d, through the selection transistor NM6 in response to the selection control signal SCS provided from the charge sharing controller 934 of FIG. 17.

The fifth read precharge unit 1022e includes a selection transistor PM5 and a diode D5. The selection transistor PM5 may be connected to the power voltage V1 node in response to the read precharge enable signal RD_PRE. The sixth read precharge unit 1022f includes a selection transistor PM6. The selection transistor PM6 may be connected to the power voltage V1 node in response to the read precharge enable signal RD_PRE. The fifth switching device 1066a_2 may include a selection transistor NM8, and a reference bit line RBL2 of the second reference memory cell REF_MC2 may be connected to a reference global bit line RGBL2, which is connected to the sense amplifier 1026, through the selection transistor NM8 in response to the selection control signal SCS provided from the charge sharing controller 934 of FIG. 17. The sixth switching device 1066b_2 may include a selection transistor NM9, and a reference source line RSL2 of the second reference memory cell REF_MC2 may be connected to a reference global source line RGSL2, which is connected to the sixth read precharge unit 1022f, through the selection transistor NM9 in response to the selection control signal SCS provided from the charge sharing controller 934 of FIG. 17.

During a first period, the first read precharge unit 1022a of the normal memory cell region C may precharge a sensing node SN, at which the global bit line GBL and the sense amplifier 1026 are connected to each other, from the level of the ground voltage Vss to the level of a second voltage, in response to the read precharge enable signal RD_PRE at a logic low level. In an exemplary embodiment of the inventive concept, the second voltage may correspond to a voltage obtained by subtracting a threshold voltage of the diode D1 from a first voltage V1. The second read precharge unit 1022b may precharge a charge sharing node CSN of the global source line GSL from the level of the ground voltage Vss to the level of the first voltage V1 during the first period, in response to the read precharge enable signal RD_PRE at a logic low level. The first voltage V1 may correspond to a power voltage $V_{DD}$ supplied from the voltage generator 140 of FIG. 2. When a read precharge operation as described above is performed, the selection transistor NM2 of the first switching device 1065a_1 and the selection transistor NM3 of the second switching device 1065b_1 may be in a turn-off state. As a result, the sensing node SN and the charge sharing node CSN may be precharged to different voltage levels by the first read precharge unit 1022a and the second read precharge unit 1022b, respectively.

In addition, a circuit structure of the reference memory cell circuit region D may be substantially the same as that of the normal memory cell circuit region C. Thus, as in the normal memory cell circuit region C, the reference sensing nodes RSN1 and RSN2 may be precharged to the level of the second voltage by the third read precharge unit 1022c and the fifth read precharge unit 1022e, respectively, and the reference charge sharing nodes RCSN1 and RCSN2 may be precharged to the level of the first voltage V1 by the fourth read precharge unit 1022d and the sixth read precharge unit 1022f, respectively.

In a second period, the selection transistors NM2, NM3, NM5, NM6, NM8, and NM9 may be turned on in response to the selection control signal SCS at a logic high level, received from the charge sharing controller 934 of FIG. 17. Since the charge sharing node CSN and the reference charge sharing nodes RCSN1 and RCSN2 are in a state in which they have been precharged to the level of the first voltage V1 and the sensing node SN and the reference sensing nodes RSN1 and RSN2 are in a state in which they have been precharged to the level of the second voltage, current may flow from the source line SL of the memory cell MC toward the bit line BL thereof and from the reference source lines RSL1 and RSL2 of the reference memory cells REF_MC1 and REF_MC2 toward the reference bit lines RBL1 and RBL2 thereof, respectively, due to potential differences between nodes.

Accordingly, in the second period, a sensing voltage $V_{SN}$ of the sensing node SN and reference sensing voltages $V_{RSN1}$ and $V_{RSN2}$ of the reference sensing nodes RSN1 and RSN2 may be developed and increase. In this case, the extent of the development of the sensing voltage $V_{SN}$ of the sensing node SN and the extent of the development of the reference sensing voltages $V_{RSN1}$ and $V_{RSN2}$ of the reference sensing nodes RSN1 and RSN2 may be changed depending on a resistance level of an MTJ device of the memory cell MC and resistance levels of MTJ devices of the reference memory cells REF_MC1 and REF_MC2. Hereinafter, for convenience of description, a resistance level of an MTJ device is referred to as a resistance level of the memory cell MC.

As shown in FIG. 5, a resistance state of the memory cell MC may vary depending on data stored therein. For example, when data '0' is written in the memory cell MC, the memory cell MC may be in the low resistance state RS1, and when data '1' is written in the memory cell MC, the memory cell MC may be in the high resistance state RS2. In an exemplary embodiment of the inventive concept, the above-described operation may be performed in a state in which first data is written in the first reference memory cell REF_MC1 and second data, which is complementary to the first data, is written in the second reference memory cell REF_MC2, and a reference voltage provider 1028 may generate a reference voltage by using developed reference sensing voltages of the reference sensing nodes RSN1 and RSN2.

For example, when data '1' is written in the first reference memory cell REF_MC1 and data '0' is written in the second reference memory cell REF_MC2, the extent of the development for a first referencing sensing voltage of the first reference sensing node RSN1 and the extent of the development for a second referencing sensing voltage of the second reference sensing node RSN2 during the second period may be different from each other when a subsequent read operation is performed. The reference voltage provider 1028 may generate an average value of a developed first reference sensing voltage and a developed second reference sensing voltage as a reference voltage and provide the reference voltage to the sense amplifier 1026. The reference voltage may correspond to the reference voltage illustrated in FIG. 5. Accordingly, data reliability may be increased by generating the reference voltage using the reference memory cells REF_MC1 and REF_MC2 having characteristics that are substantially the same as those of the memory cell MC.

Figure 19:
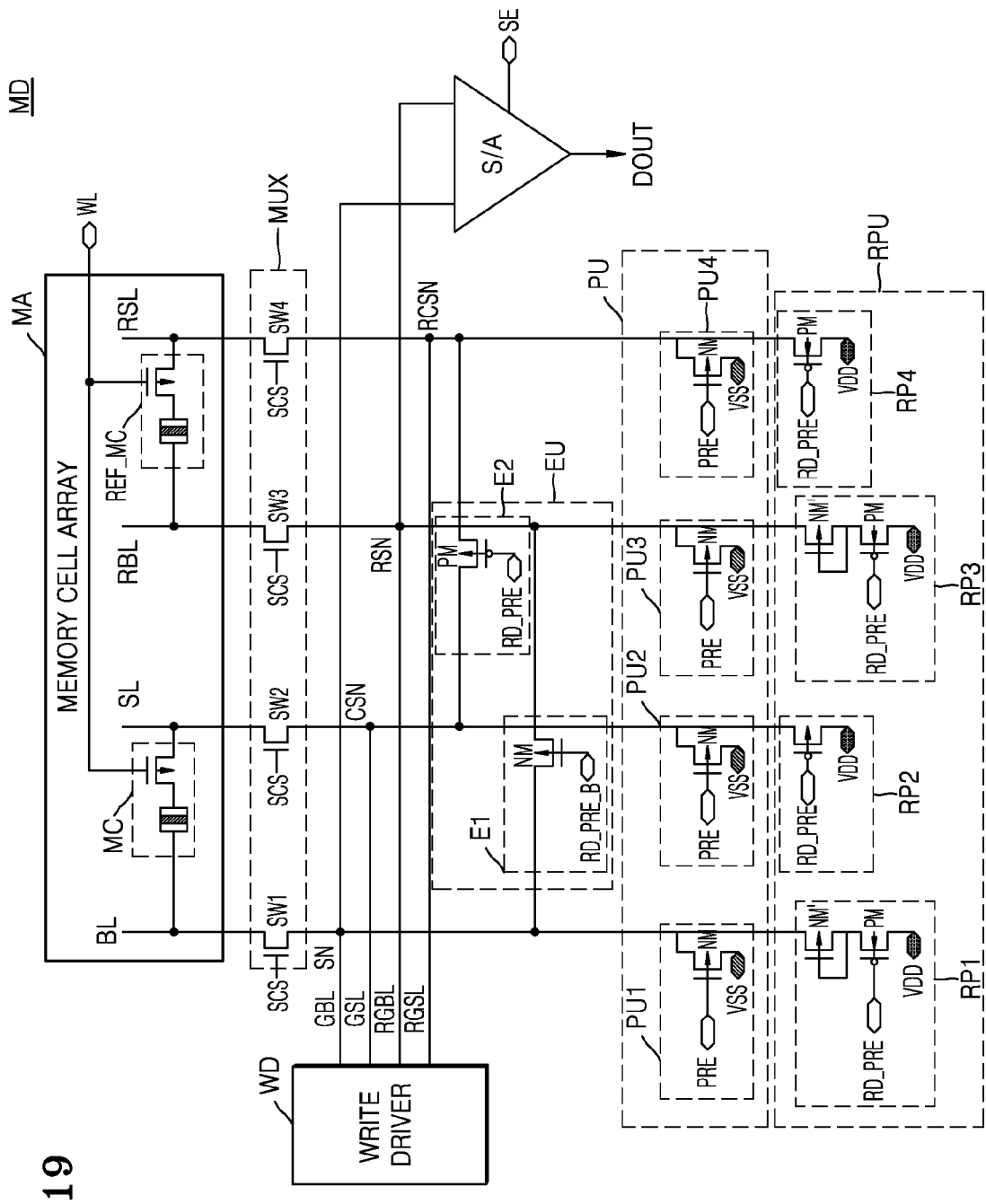
FIG. 19 is a circuit diagram of a memory device including the memory cell array illustrated in FIG. 10, according to an exemplary embodiment of the inventive concept.
Figure 20:
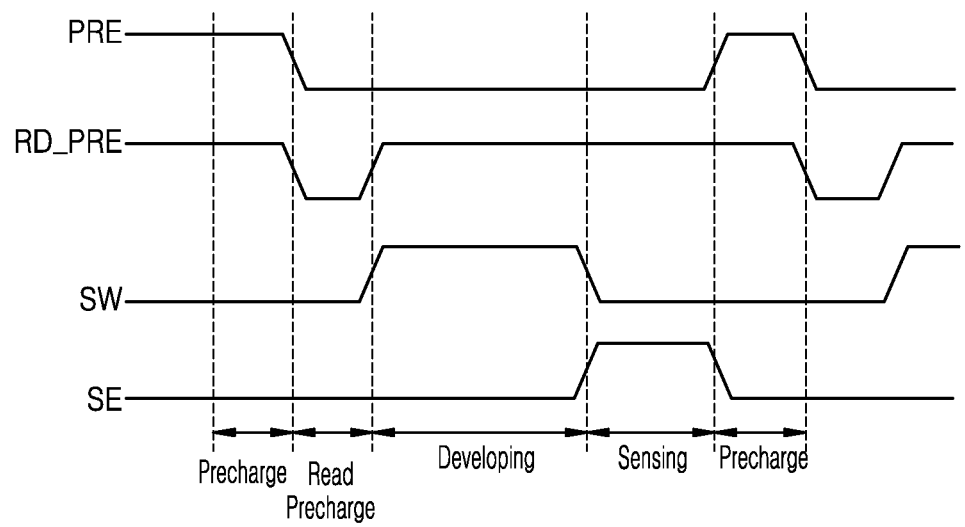
FIG. 20 is a timing diagram for describing a read operation of the memory device of FIG. 19, according to an exemplary embodiment of the inventive concept.

FIG. 19 is a circuit diagram of a memory device MD including the memory cell array illustrated in FIG. 10, according to an exemplary embodiment of the inventive concept. FIG. 20 is a timing diagram for describing a read operation of the memory device of FIG. 19, according to an exemplary embodiment of the inventive concept.

Referring to FIG. 19, the memory device MD may include a memory cell array MA, a multiplexer MUX, an equalizing unit EU, a precharge unit PU, a read precharge unit RPU, a write driver WD, and a sense amplifier S/A. The memory cell array MA may include a memory cell MC selected as a read target and a reference memory cell REF_MC corresponding to the memory cell MC. The multiplexer MUX may include a first switching device SW1 and a second switching device SW2, which may connect a bit line BL and a source line SL to a global bit line GBL and a global source line GSL, respectively. The bit line BL and source line SL are connected to the memory cell MC. The multiplexer MUX may further include a third switching device SW3 and a fourth switching device SW4, which may connect a reference bit line RBL and a reference source line RSL to a reference global bit line RGBL and a reference global source line RGSL, respectively. The reference bit line RBL and reference source line RSL are connected to the reference memory cell REF_MC. In an exemplary embodiment of the inventive concept, the multiplexer MUX may be an element included in the column decoder 160 of FIG. 2. The equalizing unit EU may include a first equalizer E1 for equalizing a voltage level between a sensing node SN and a reference sensing node RSN during a read precharge operation and a second equalizer E2 for equalizing a voltage level between a charge sharing node CSN and a reference charge sharing node RCSN during the read precharge operation. The first equalizer E1 may include an NMOS transistor NM and the second equalizer E2 may include a PMOS transistor PM.

The precharge unit PU may include a first precharge unit PU1 for precharging the sensing node SN to a ground voltage Vss, a second precharge unit PU2 for precharging the charge sharing node CSN to the ground voltage Vss, a third precharge unit PU3 for precharging the reference sensing node RSN to the ground voltage Vss, and a fourth precharge unit PU4 for precharging the reference charge sharing node RCSN to the ground voltage Vss. Each of the precharge units PU1~PU4 may include an NMOS transistor NM.

The read precharge unit RPU may include a first read precharge unit RP1 for precharging the sensing node SN to a second power voltage, a second read precharge unit RP2 for precharging the charge sharing node CSN to a first power voltage V1, a third read precharge unit RP3 for precharging the reference sensing node RSN to the second power voltage, and a fourth read precharge unit RP4 for precharging the reference charge sharing node RCSN to the first power voltage V1. Each of the read precharge units RP1~RP4 may include a PMOS transistor PM. The second power voltage may correspond to a voltage obtained by subtracting a threshold voltage of a transistor NM', included in the first read precharge unit RP1 or the third read precharge unit RP3, from the first power voltage V1.

Referring to FIGS. 19 and 20, during a precharge period Precharge, the first to fourth precharge units PU1 to PU4 of the precharge unit PU may precharge the sensing node SN, the charge sharing node CSN, the reference sensing node RSN, and the reference charge sharing node RCSN, respectively, to the ground voltage Vss in response to a precharge enable signal PRE at a logic high level. During a read precharge period Read Precharge, the first and third read precharge units RP1 and RP3 of the read precharge unit RPU may precharge the sensing node SN and the reference sensing node RSN, respectively, to a second voltage level in response to a read precharge enable signal RD_PRE at a logic low level. The second and fourth read precharge units RP2 and RP4 of the read precharge unit RPU may precharge the charge sharing node CSN and the reference charge sharing node RCSN, respectively, to a first voltage level in response to the read precharge enable signal RD_PRE at a logic low level. A read precharge enable inversion signal RD_PRE_B may be an inverted signal for the read precharge enable signal RD_PRE. During a development period Developing, all of the first to fourth switching devices SW1 to SW4 of the multiplexer MUX may be turned on in response to a switching signal SW at a logic high level. In this case, a charge sharing operation between a sensing voltage of the sensing node SN and a voltage of the chare sharing node CSN may be performed and thus the sensing voltage may be developed. A charge sharing operation between a reference sensing voltage of the reference sensing node RSN and a voltage of the reference charge sharing node RCSN may be performed and thus the reference sensing voltage may be developed. During a sensing period Sensing, the sense amplifier S/A may compare a developed sensing voltage to a developed reference sensing voltage in response to a sensing enable signal SE at a logic high level and may output data written in the memory cell MC. Next, through the precharge period Precharge again, the sensing node SN, the charge sharing node CSN, the reference sensing node RSN, and the reference charge sharing node RCSN may be precharged to the ground voltage Vss.

Figure 21:
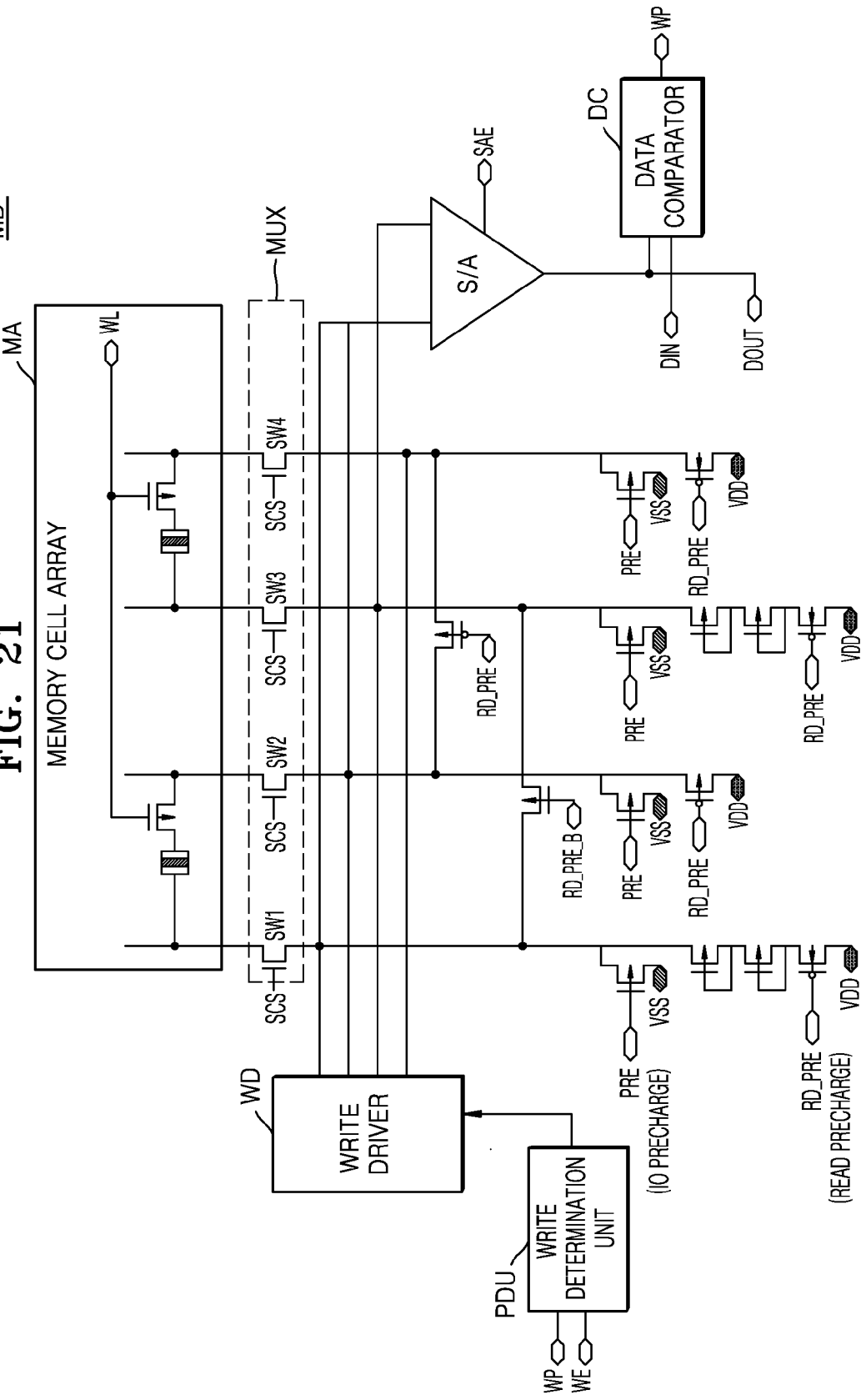
FIG. 21 is a circuit diagram of a memory device according to an exemplary embodiment of the inventive concept.

FIG. 21 is a circuit diagram of a memory device MD' according to an exemplary embodiment of the inventive concept.

Referring to FIG. 21, the memory device MD' may further include a data comparator DC and a program decision unit PDU, as compared to the memory device MD of FIG. 19. The data comparator DC may compare output data DOUT received from a sense amplifier S/A to input data DIN to be written in a memory cell MC, in response to a write command, and may generate a write permission signal WP based on a comparison result. In an exemplary embodiment of the inventive concept, the data comparator DC may include an XOR gate. In this case, the data comparator DC may generate the write permission signal WP at a logic low level when the input data DIN is the same as the output data DOUT, and may generate the write permission signal WP at a logic high level when the input data DIN is different from the output data DOUT. The data comparator DC may provide the write permission signal WP to the program decision unit PDU.

The program decision unit PDU may determine whether to perform an operation of writing the input data DIN in the memory cell MC, by controlling a write driver WD based on a write enable signal WE and the write permission signal WP. In an exemplary embodiment of the inventive concept, the program decision unit PDU may be configured with a NAND gate and an inverter which are connected in series. The program decision unit PDU may control the write driver WD to write the input data DIN in the memory cell MC when the input data DIN is different from the output data DOUT. Through this configuration, only data that is different from data stored in the memory cell MC is written in the memory device MD' and thus a write speed of the memory device MD' may be increased.

Figure 22:
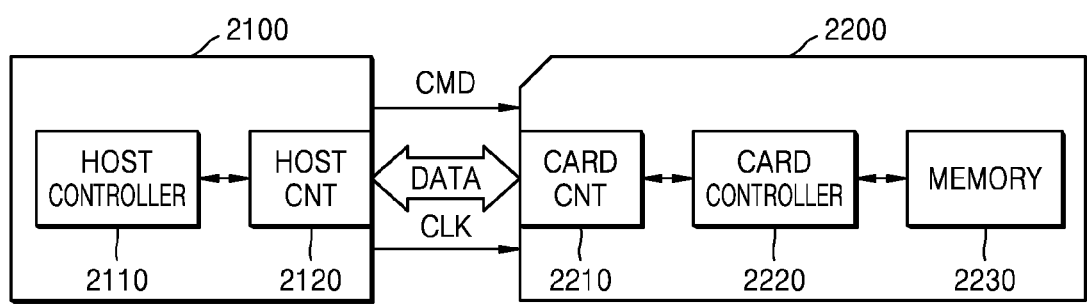
FIG. 22 is a block diagram of a memory system according to an exemplary embodiment of the inventive concept applied to a memory card system.

FIG. 22 is a block diagram of a memory system according to an exemplary embodiment of the inventive concept applied to a memory card system 2000.

Referring to FIG. 22, the memory card system 2000 may include a host 2100 and a memory card 2200. The host 2100 may include a host controller 2110 and a host connector 2120. The memory card 2200 may include a card connector 2210, a card controller 2220, and a memory device 2230. Here, the memory card 2200 may be embodied by the exemplary embodiments described with reference to FIGS. 1 to 22.

The host 2100 may write data in the memory card 2200, or may read data stored in the memory card 2200. The host controller 2110 may transmit a command CMD, a clock signal CLK generated by a clock generator in the host 2100, and data DATA to the memory card 2200 via the host connector 2120.

The card controller 2220 may synchronize data with the clock signal CLK to store the data in the memory device 2230, in response to the command CMD received via the card connector 2210. The memory device 2230 may store the data DATA transmitted from the host 2100.

The memory card 2200 may be embodied as a compact flash card (CFC), a microdrive, a smart media card (SMC), a multimedia card (MMC), a security digital card (SDC), a memory stick, a USB flash memory driver, or the like.

Figure 23:
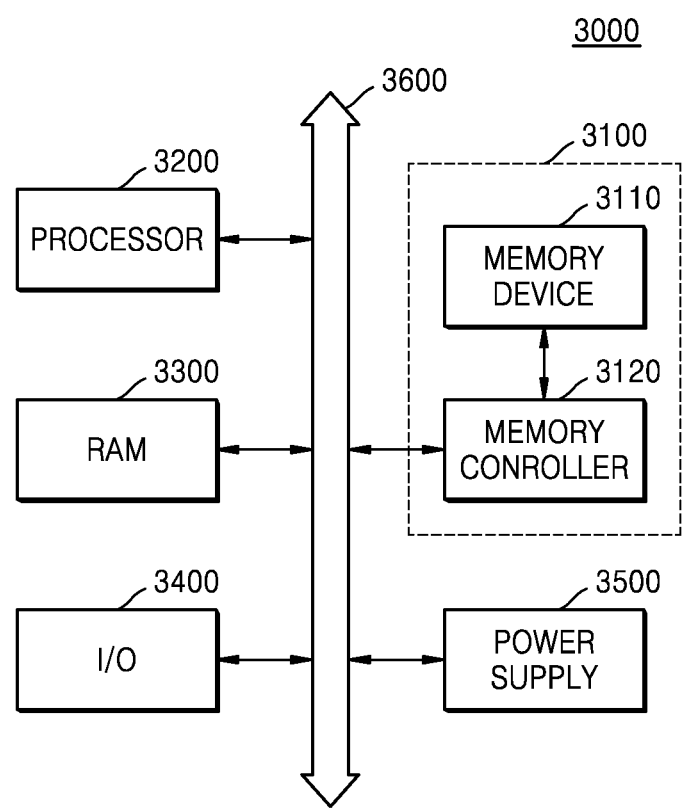
FIG. 23 is a block diagram of a computing system that includes a memory system according to an exemplary embodiment of the inventive concept.

FIG. 23 is a block diagram of a computing system 3000 that includes a memory system according to an exemplary embodiment of the inventive concept.

Referring to FIG. 23, the computing system 3000 may include a memory system 3100, a processor 3200, a RAM 3300, an input/output (I/O) unit 3400, and a power supply 3500. Although not illustrated in FIG. 23, the computing system 3000 may communicate with a video card, a sound card, a memory card, a USB device, or the like, or may further include ports via which the computing system 3000 may communicate with other electronic devices. The computing system 3000 may be embodied by a personal computer, or by a portable electronic device such as a laptop computer, a cellular phone, a personal digital assistant (PDA), or a camera.

The processor 3200 may perform calculations or tasks. According to exemplary embodiments of the inventive concept, the processor 3200 may be a micro-processor or a central processing unit (CPU). The processor 3200 may communicate with the RAM 3300, the I/O unit 3400, and the memory system 3100 via a bus 3600 such as an address bus, a control bus, or a data bus. The memory system 3100 may include a memory device 3110 and a memory controller 3120. Here, the memory system 3100 may be embodied by the exemplary embodiments described with reference to FIGS. 1 to 21.

In an exemplary embodiment of the inventive concept, the processor 3200 may be connected to an extension bus such as a peripheral component interconnect (PCI).

The RAM 3300 may store data required for operation of the computing system 3000. For example, the RAM 3300 may be embodied by DRAM, mobile DRAM, SRAM, PRAM, FRAM, RRAM, and/or MRAM.

The I/O unit 3400 may include an input device such as a keyboard, a keypad, or a mouse, and an output device such as a printer or a display. The power supply 3500 may provide an operation voltage required for operation of the computing system 3000.

Figure 24:
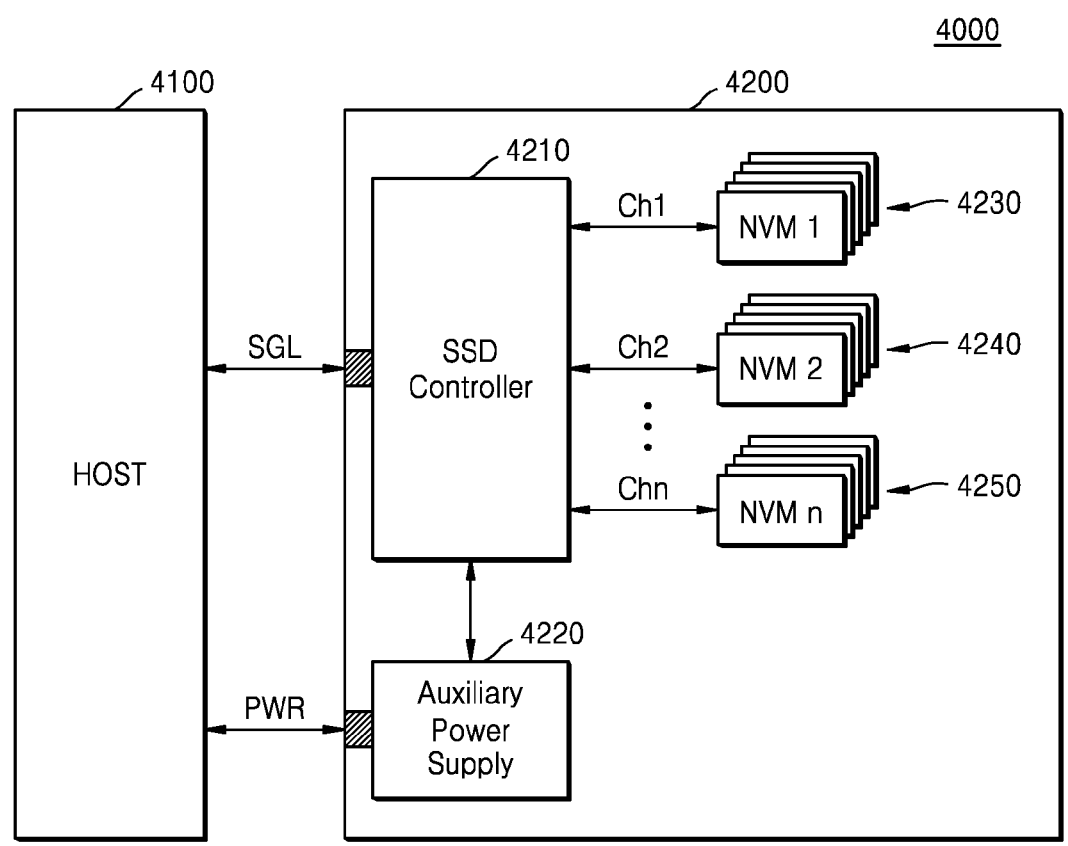
FIG. 24 is a block diagram of a memory system according to an exemplary embodiment of the inventive concept applied to a Solid State Disk/Drive (SSD) system.

FIG. 24 is a block diagram of a memory system according to an exemplary embodiment of the inventive concept applied to a SSD system 4000.

Referring to FIG. 24, the SSD system 4000 may include a host 4100 and an SSD 4200. The SSD 4200 may transmit and receive a signal SGL to and from the host 4100 via a signal connector and receive power PWR via a power connector. The SSD 4200 may include an SSD controller 4210, an auxiliary power supply 4220, and a plurality of non-volatile memory devices 4230, 4240, and 4250. Here, the SSD 4200 may be embodied by the exemplary embodiments described with reference to FIGS. 1 to 21.

While the inventive concept has been particularly shown and described with reference to exemplary embodiments thereof, it will be understood by those of ordinary skill in the art that various changes in form and details may be made thereto without departing from the spirit and scope of the inventive concept as defined by the following claims.

What is claimed is:

1. A memory device, comprising:
a memory cell array comprising a memory cell having a resistance level that varies depending on first data stored therein, wherein the memory cell is connected to a first signal line and a second signal line;
a read circuit configured to read the first data; and
a control logic configured to precharge a sensing node, connected to the first signal line through a first switching device, and a first node, connected to the second signal line through a second switching device, to different voltage levels during a first period, and develop a voltage of the sensing node based on the resistance level of the memory cell during a second period.

2. The memory device of claim 1, wherein the control logic is configured to control the read circuit to sense a developed voltage of the sensing node and read the first data, during a third period.

3. The memory device of claim 2, wherein the control logic is configured to turn off the first and second switching devices during the first period or the third period.

4. The memory device of claim 1, wherein the read circuit comprises:
a first read precharge unit configured to provide a second voltage to the sensing node during the first period; and
a second read precharge unit configured to provide a first voltage to the first node during the first period.

5. The memory device of claim 4, wherein a level of the first voltage is greater than that of the second voltage.

6. The memory device of claim 4, wherein the first read precharge unit comprises a first switching device connected to a power voltage node and at least one diode, and the second read precharge unit comprises a second switching device connected to the power voltage node.

7. The memory device of claim 4, wherein the control logic turns off a first switching device of the first read precharge unit and a second switching device of the second precharge unit during the second period, and turns on the first switching device and the second switching device during the second period.

8. The memory device of claim 1, wherein the first signal line is a bit line and the second signal line is a source line.

9. The memory device of claim 1, wherein the memory cell array comprises a first reference memory cell having a structure that is substantially the same as that of the memory cell,
wherein the first reference memory cell is connected to a first reference signal line and a second reference signal line and configured to store second data that is complementary to the first data stored in the memory cell,
wherein the control logic is configured to precharge a first reference sensing node, connected to the first reference signal line through a first switching device, and a first reference node, connected to the second reference signal line through a second switching device, to different voltage levels during the first period, and develop a first reference sensing voltage of the first reference sensing node based on a resistance level of the first reference memory cell during the second period,
wherein the control logic is configured to control the read circuit to read the first data by using the voltage of the sensing node and the first reference sensing voltage of the first reference sensing node.

10. The memory device of claim 9, wherein the memory cell array comprises a second reference memory cell having a structure that is substantially the same as that of the memory cell,
wherein the second reference memory cell is connected to a third reference signal line and a fourth reference signal line and configured to store third data that is complementary to the second data stored in the first reference memory cell,
wherein the control logic is configured to precharge a second reference sensing node, connected to the third reference signal line through a third switching device, and a second reference node, connected to the fourth reference signal line through a fourth switching device, to different voltage levels during the first period, and develop a second reference sensing voltage of the second reference sensing node based on a resistance level of the second reference memory cell during the second period,
wherein the control logic is configured to control the read circuit to read the first data by using the voltage of the sensing node, the first reference sensing voltage of the first reference sensing node, and the second reference sensing voltage of the second reference sensing node.

11. A memory system, comprising:
a resistive memory device; and
a memory controller configured to control the resistive memory device,
wherein the resistive memory device comprises:
a memory cell array comprising a memory cell for storing first data, wherein the memory cell is connected to a first signal line and a second signal line;
a control logic configured to control a read operation for the first data; and
a read circuit configured to precharge a sensing node and a first node to different voltage levels during a first period in response to a read control signal received from the control logic,
wherein the sensing node is connected to the first signal line through a first switching device and the first node is connected to the second signal line through a second switching device.

12. The memory system of claim 11, wherein the control logic controls the first switching device and the second switching device to develop a sensing voltage of the sensing node based on a resistance level of the memory cell during a second period.

13. The memory system of claim 12, wherein the read circuit comprises a sense amplifier configured to sense the first data by using the developed sensing voltage and a reference voltage.

14. The memory system of claim 11, wherein the read circuit reads the first data of the memory cell in response to a write command received from the memory controller, wherein the write command is for writing second data in the memory cell, and
wherein the resistive memory device further comprises a write controller configured to compare the first data to the second data and determine whether to write the second data in the memory cell.

15. The memory system of claim 14, wherein the resistive memory device further comprises a write driver configured to perform a write operation to write data in the memory cell, and
wherein the write controller controls the write driver to only write the second data when the second data is different from the first data.

* * * * *